(12) United States Patent
Abedifard et al.

(10) Patent No.: US 8,363,460 B2
(45) Date of Patent: Jan. 29, 2013

(54) METHOD AND APPARATUS FOR PROGRAMMING A MAGNETIC TUNNEL JUNCTION (MTJ)

(75) Inventors: Ebrahim Abedifard, Sunnyvale, CA (US); Petro Estakhri, Danville, CA (US)

(73) Assignee: Avalanche Technology, Inc., Fremont, CA (US)

( * ) Notice: Subject to any disclaimer, the term of this patent is extended or adjusted under 35 U.S.C. 154(b) by 133 days.

(21) Appl. No.: 12/826,546

(22) Filed: Jun. 29, 2010

(65) Prior Publication Data
US 2011/0249491 A1 Oct. 13, 2011

Related U.S. Application Data

(63) Continuation-in-part of application No. 12/756,081, filed on Apr. 7, 2010.

(51) Int. Cl.
*G11C 11/00* (2006.01)
*G11C 11/14* (2006.01)
*G11C 11/15* (2006.01)

(52) U.S. Cl. .................. 365/158; 365/171; 365/173
(58) Field of Classification Search .................. 365/158, 365/171, 173
See application file for complete search history.

(56) References Cited

U.S. PATENT DOCUMENTS

| | | | | |
|---|---|---|---|---|
| 6,452,823 B1 * | 9/2002 | Naji | ............................... | 365/158 |
| 7,995,378 B2 * | 8/2011 | Yoon et al. | .................... | 365/158 |
| 7,995,383 B2 * | 8/2011 | Li et al. | ........................ | 365/158 |
| 8,004,881 B2 * | 8/2011 | Zhu et al. | ...................... | 365/158 |
| 8,040,713 B2 * | 10/2011 | Chen et al. | ..................... | 365/158 |

* cited by examiner

*Primary Examiner* — Trong Phan
(74) *Attorney, Agent, or Firm* — Maryam Imam; IPxLaw Group LLP

(57) ABSTRACT

A method of writing to magnetic tunnel junctions (MTJs) of a magnetic memory array includes storing in-coming data in a cache register, reading the present logic state of a first one of a set of at least two MTJs, the set of at least two MTJs including the first MTJ and a second MTJ. The in-coming data is to be written into the second MTJ. Further steps are storing the read logic state into a data register, swapping the contents of the data register and the cache register so that the cache register stores the read logic state and the data register stores the in-coming data, applying a first predetermined voltage level to the set of MTJs thereby causing the first MTJ to be over-written, applying a second predetermined voltage level to the set of MTJs, and storing the in-coming data into the second MTJ.

13 Claims, 24 Drawing Sheets

MLC State table:

| Data States | | Fix Layer | Free Layer MTJ 21 | Free Layer MTJ 13 | Total Resistance |
|---|---|---|---|---|---|
| R00 | 0 0 | ↑ | ↑ | ↑ | RL_2 + RL_1 3448 Ohm |
| R01 | 0 1 | ↑ | ↑ | ↓ | RL_2 + RH_1 6531 Ohm |
| R10 | 1 0 | ↑ | ↓ | ↑ | RH_2 + RL_1 5180 Ohm |
| R11 | 1 1 | ↑ | ↓ | ↓ | RH_2 + RH_1 8263 Ohm |

Table 1

FIG. 25

Write

| Operation | WL | BL | SL |
|---|---|---|---|
| MTJ Write Ø | 1.2V - 1.4V | 0.5V - 0.7V | 0 |
| MTJ Write 1 | 1.2V - 1.4V | 0 | 0.5V - 1.2V |
| MTJ Write 0 | 1.4V - 1.8V | 0.7V - 1.2V | 0 |
| MTJ Write 1 | 1.4V - 1.8V | 0 | 0.7V - 1.2V |

Table 2

FIG. 26

METHOD AND APPARATUS FOR PROGRAMMING A MAGNETIC TUNNEL JUNCTION (MTJ)

CROSS REFERENCE TO RELATED APPLICATIONS

This application is a continuation-in-part of U.S. patent application Ser. No. 12/756,081, filed on Apr. 7, 2010, by Ebrahim Abedifard, and entitled "Shared Transistor in a Spin-Torque Transfer Magnetic Random Access Memory (STTM-RAM) Cell", which claims the benefit of U.S. Provisional Patent Application No. 61/167,859, entitled "Shared Transistor in a Spin-Torque Transfer Magnetic Random Access Memory (STTMRAM) Cell", by Ebrahim Abedifard, and filed on Apr. 8, 2009, the disclosures of all of which are incorporated herein by reference as though set forth in full.

BACKGROUND OF THE INVENTION

1. Field of the Invention

The present invention relates generally to magnetic memory systems having magnetic tunnel junctions (MTJs) that store binary data and particularly to programming of the MTJs.

2. Description of the Prior Art

Magnetic random access memory (MRAM) is rapidly gaining notoriety as its use in replacing conventional memory is showing promise. Magnetic tunnel junctions (MTJs), which are essentially the devices storing information, include various layers that determine the magnetic behavior of the device. An exemplary MTJ uses spin torque transfer to effectuate a change in the direction of magnetization of one or more free layers in the MTJ. That is, writing bits of information is achieved by using a spin polarized current flowing through the MTJ, instead of using a magnetic field, to change states or program/write/erase/read bits. Currently, the problem with MRAMs are their size. Obviously, reducing the size of a MRAM cell is highly desirable.

Moreover, increasing memory capacity by stacking more than one MTJ on top of another provides great value in terms of costs and real estate on a semiconductor or chip. To this end, writing to or programming of stacked or multi-state MTJs is needed. The current state of technology does not allow for writing or programming a stack of MTJs.

Thus, the need arises for a magnetic memory array to include an array of magnetic memory made of MTJs having small cell sizes and a method and apparatus for writing to a stack of MTJs made of more than one MTJ.

SUMMARY OF THE INVENTION

To overcome the limitations in the prior art described above, and to overcome other limitations that will become apparent upon reading and understanding the present specification, the present invention discloses a method and a corresponding structure for a magnetic memory system including magnetic tunnel junctions (MTJs) and structures and methods for programming the same.

Briefly, a method of the present invention includes writing to magnetic tunnel junctions (MTJs) of a magnetic memory array includes storing in-coming data in a cache register, reading the present logic state of a first one of a set of at least two MTJs, the set of at least two MTJs including the first MTJ and a second MTJ. The in-coming data is to be written into the second MTJ. Further steps are storing the read logic state into a data register, swapping the contents of the data register and the cache register so that the cache register stores the read logic state and the data register stores the in-coming data, applying a first predetermined voltage level to the set of MTJs thereby causing the first MTJ to be over-written, applying a second predetermined voltage level to the set of MTJs, and storing the in-coming data into the second MTJ.

These and other objects and advantages of the present invention will no doubt become apparent to those skilled in the art after having read the following detailed description of the preferred embodiments illustrated in the several figures of the drawing.

IN THE DRAWINGS

FIG. 25 shows the total resistance of the STTMRAM 10 with the STTMRAM 10 having the foregoing sizes/thicknesses/lengths/widths and the indicated logical states of: "00", "01", "10", "11".

FIG. 26 shows an example of the voltage levels of the BL, WL and SL during a write operation to the MTJs of the set of MTJs 238.

DETAILED DESCRIPTION OF THE PREFERRED EMBODIMENTS

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the present invention. It should be noted that the figures discussed herein are not drawn to scale and thicknesses of lines are not indicative of actual sizes.

Figure 1:
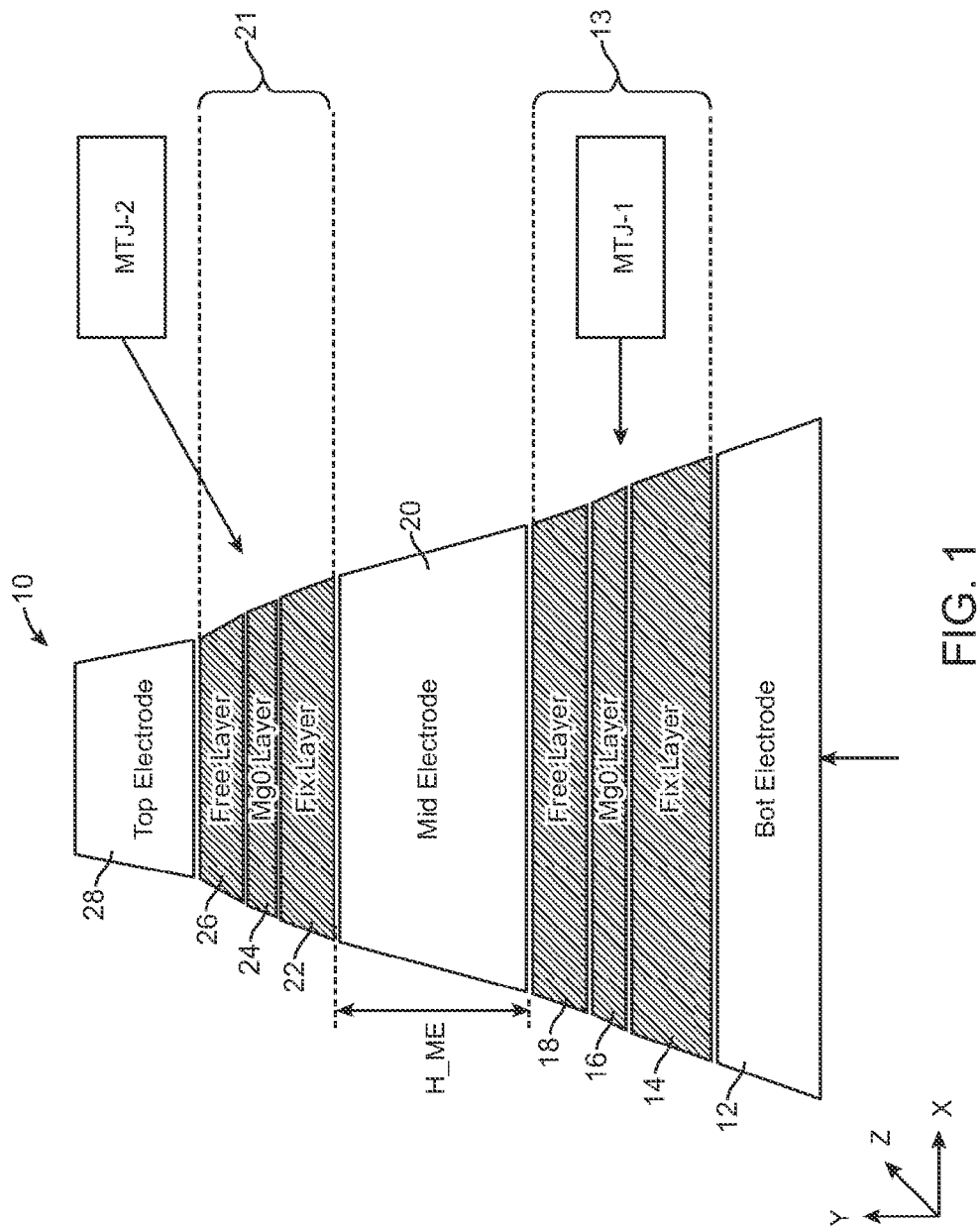
FIG. 1 shows a spin-transfer torque magnetic random access memory (STTMRAM) 10, in accordance with an embodiment of the present invention.

FIG. 1 shows a spin-transfer torque magnetic random access memory (STTMRAM) 10, in accordance with an embodiment of the present invention. As will be evident shortly, the STTMRAM 10 is a pillar or stack of magnetic tunnel junctions (MTJs).

In FIG. 1, the SSTMRAM 10 is shown to include a bottom electrode, a MTJ 13 shown formed on top of the bottom electrode 12, a middle electrode 20 shown formed on top of the MTJ 13, a MTJ 21 shown formed on top of the middle electrode and a top electrode 28 shown formed on top of the MTJ 21. The bottom electrode is typically formed on top of a substrate (not shown) on a wafer. It is noted that a wafer typically includes many STTMRAMs such as the STTMRAM 10.

In accordance with an embodiment of the present invention, STTMRAM, as used herein, refers to magnetic memory cells having spin torque transfer characteristics and including at least one select transistor. The STTMRAM may include core (memory) and peripheral circuits, row and column decoders, sense amplifiers and the like.

In a STTMRAM, writing magnetic bits is achieved by using a spin polarized current flowing through the MTJ, instead of using a magnetic field, to change states or program/write/erase/read bits. The STTMRAM write current scales down with smaller MTJ size. STTMRAM has significant advantages over magnetic-field-switched MRAM, which has been recently commercialized. One of the main drawbacks associated with field switched MRAM is its more complex cell architecture, which utilizes typically two additional metal lines for applying the switching field, in a one transistor and one MTJ design. There are therefore added processing steps that make the memory-cell size too big and too expensive. Additional drawbacks include high write current (currently in the order of milli Amps (mA)) requirements and poor scalability, which is currently limited to about 65 nano meters (nm). On the other hand, in the STTMRAM, uses spin transfer torque (STT) writing technology, by directly passing a current through the MTJ, thereby overcoming the foregoing hurdles with much lower switching current (in the order of micro Amps) and ease of scalability. This results in a simpler cell architecture that can be as small as $6F^2$ (for single-bit cells) and reduced manufacturing cost, and improved scalability. Additionally, due to its fast read/write speed and lower voltage level requirement, STTMRAM is believed to be an ideal candidate for replacing SRAM as an embedded memory into Logic devices such as from microprocessors.

In FIG. 1, the MTJ 13 is shown to include a fixed layer 14 formed on top of the bottom electrode 12, a barrier layer 16, shown formed on top of the fixed layer 14 and a free layer 18 shown formed on top of the barrier layer 16. Similarly, the MTJ 21 is shown to include a fixed layer 22 shown formed on top of the middle electrode 20, a barrier layer 24 shown on top of the middle electrode 20 and a free layer shown formed on top of the barrier layer 24. The top electrode 28 is shown formed on top of the free layer 26.

Each of the MTJs 13 and 21 are made of layers that are generally known. For example, in some designs, the fixed layers 14 and 22 are each typically made of three layers namely, cobolt irom (CoFe) formed on top of the bottom electrode 12, on top of which is formed ruthenium (Ru) on top of which is formed cobolt iron boron (CoFeB) in a manner such that these layers are anti-ferromagnetically coupled to each other. The barrier layers 16 and 24 are each typically made of one or more of the following materials: magnesium oxide (MgO), titanium oxide(TiO2), aluminum oxide (Al2O3), zinc oxide(ZnO), ruthenium oxide(RuO) and strontium oxide(SrO). The free layers 18 and 26 are each made of one or more of the following alloys: CoFeB and CoFeBx, where 'x' is one or more of chromium (Cr), titanium (Ti), tantalum (Ta), zirconium (Zr), and hafnium (Hf).

The middle electrode 20 is generally made of a non-magnetic material and serves as an isolation layer. In some embodiments, the middle electrode 20 is one layer and in other embodiments, it is multi-layered. Exemplary non-magnetic materials of which the middle electrode 20 may be made include but are not limited to: tantalum(Ta), titanium(Ti), ruthenium(Ru), chromium(Cr), tungsten(W), titanium tungsten (TiW), nickel niobium(NiNb), copper(Cu), copper nitride(CuN), tantalum nitride(TaN), titanium and nitride (TiN). The thickness of the middle electrode 20 in some embodiments of the present invention is anywhere from 5 nano meters to 500 nano meters.

The bottom electrode is typically made of tantalum(Ta), titanium(Ti), ruthenium(Ru), chromium(Cr), tungsten(W), titanium tungsten (TiW), nickel niobium(NiNb), copper(Cu), copper nitride(CuN), tantalum nitride(TaN), titanium nitride (TiN). The top electrode 28 is typically made of tantalum(Ta), titanium(Ti), ruthenium(Ru), chromium(Cr), tungsten(W), titanium tungsten (TiW), nickel niobium(NiNb), copper(Cu), copper nitride(CuN), tantalum nitride(TaN), and titanium nitride(TiN).

While the STTMRAM 10 is shown to include two MTJs, MTJ 13 and MTJ 21, it is understood that in other embodiments, more than two MTJs may be formed in the SSTMRAM of the various embodiments of the present invention by separating two MTJs from each other with a middle electrode.

It is understood that while materials are suggested herein for the formation of various layers, that other suitable material is contemplated.

However, the shape and size of each of the layers of the STTMRAM 10, including the layers forming the MTJs 13 and 21, are advantageously different than that of prior art techniques allowing for a smaller area on the wafer to be used for building the MTJ 21, which has a higher resistance area (RA) associated therewith due to its smaller MTJ size and the resistance area (RA) of each of the MTJs can be easily adjusted to a desirable value by changing the thicknesses of the barrier layers 16 and 24.

The tunnel magnetoresistance (TMR) associated with the STTMRAM 10 requires adjusting in order to allow for ample separation resistance between the different states taken on by the STTMRAM 10. This will become more apparent below namely, if two MTJs are to be used, the four resistance states are: Rl1+Rl2, Rh1+Rh2, Rl1+Rh2 and Rl2+Rh1 where Rl1 and Rh1 respectively represent a low resistance and a high resistance associated with one of the MTJs, Rl2 and Rh2 respectively represent a low and a high resistance associated with another one of the MTJs. The TMRs and resistance area (RA) of the MTJs are such chosen that the four states are relatively equally spaced.

In operation, current is applied through the STTMRAM 10, in a direction denoted by the arrow shown in FIG. 1 with a current flow into the bottom electrode 12, and depending on the level of the current (sometime referred to as "switching current"), which affects the resistance taken on by the STTMRAM 10, the logical state of the STTMRAM 10 is switched. The state of the STTMRAM 10 is influenced by the resistance thereof. In this manner, the STTMRAM 10 stores up to 4 different logic states due to its inclusion of two MTJs, thus, the STTMRAM 10 stores multiple states simultaneously. With the presence of more than MTJs in a STTMRAM, additional states are realized.

It is noted that the current flow through the STTMRAM 10 may be from the top electrode 28 down through the remaining layers of the STTMRAM 10.

TMR is typically known by the representation in the following equations:

$$TMR = (RH - RL)/RL \quad \text{Eq. (1)}$$

where RL refers to the resistance of a MTJ when the magnetic orientations of the fixed layer of the MTJ and the free layer of the same MTJ are parallel relative to each other, referred to as a "parallel" state, and RH refers to the resistance of a MTJ when the magnetic orientations of the fixed layer of the MTJ and the free layer of the same MTJ are anti-parallel relative to each other, referred to as an "anti-parallel" state.

As shown in FIG. 1, the STTMRAM 10 has a substantially trapezoidal (or pyramid) shape, which allows the foregoing advantages to be realized. That is, due to the STTMRAM shape, the MTJ 21 is smaller in size than the MTJ 13 therefore allowing a smaller area than when the MTJs are the same size because as the stack of MTJs is built, the top area of the STTMRAM 10 can be better controlled by the thickness of the middle electrode 20. The height or thickness of the middle electrode 20 is indicated in FIG. 1 and referred to herein as "H_ME". A typical range for the thickness of the middle electrode 20 is 1 nanometer (nm) to 100 nm with a typical preferred thickness of about 50 nm.

Due to the trapezoidal shape of the STTMRAM 10, each layer thereof is also generally shaped as a trapezoid. For example, the bottom electrode 12 is shaped generally as a trapezoid with two parallel sides (top and bottom thereof) and sloped (or angled) sides where the length of the bottom of the bottom electrode 12 is larger than the length of the top of the bottom electrode 12 due to the angled sides thereof. Similarly, the fixed layer 14 is substantially trapezoidal in shape with the length of its top being shorter than that of its bottom due to its slanted or angled sides and so one with each of the remaining layers of the STTMRAM 10. This results in each layer that is on top of another being smaller than the layers underneath it with the top most layer, the top electrode 28 having the shortest top of all of the other layers. Thus, each layer that resides on top of another is necessarily smaller in a corresponding bottom or top thereof than the layers under it. In this manner, each layer subsequent or adjacently on top of another layer has a smaller length (the length being across the x-axis) associated with its bottom layer than that of the layer that is adjacently below it. In this manner, the STTMRAM 10 takes on substantially a pyramid or trapezoidal shape.

The trapezoidal shape of the MTJ 21 renders the MTJ 21 smaller in size than that of the MTJ 21. This is due to the formation of the MTJ 21 being on top of the stack forming the STTMRAM 10. Stated differently, the MTJ 21 being formed on top of the MTJ 13 is smaller in size than the MTJ 13.

While a higher RA is chosen in association with the MTJ 21 due to the latter's smaller size (or area), a higher RA is chosen than the RA associated with the RA of the MTJ 21 in association with the MTJ 13 resulting in lower programming current density ($J_{co}$) associated with the MTJ 13. The middle electrode 20 is typically formed of one or more non-magnetic conducting layers having a thickness of 0.5 nm to 100 nm. This layer should have enough thickness to ensure that the top MTJ 21 is magnetically decoupled from the lower MTJ 13. In an exemplary embodiment, the middle electrode 20 is made of tantalum, Ta, tantalum nitride, TaN, or titanium nitride, TiN. In a yet another embodiment it is comprised of one or more of the following material: copper (Cu), ruthenium (Ru), and CuN.

In an exemplary embodiment of the present invention, the RA, TMR, $J_{co}$, size and area of each of the MTJs 13 and 21 are as follows:

MTJ 13:
   RA=14 Ohm/cm2
   TMR=150%
   JC0=1.0e+06 A/cm2
   MTJ_Size=60×130 nm2
   MTJ Area=0.0061 um2
MTJ 21:
   RA=6 Ohm/cm2
   TMR=150%
   JC0=2.0e+06 uA/cm2
   MTJ_Size=55×120 nm2
   MTJ_Area=0.0052 um2

In the foregoing embodiment, the switching current (ISW), RL and RH for each MTJ are as follows:
MTJ 13:
Switching current ($I_{SW}$)=JC0*MTJ_Area=0.0061 um2*1.0e+06 uA/cm2=61 uA
RL=RA*MTJ_Area=140 ohm-um$^2$/0.0061 um$^2$=2295 Ohm; wherein um represents micro meters
RH=RL_1*2.5=2885 Ohm
MTJ 21:
   $I_{SW}$=JC0*MTJ_Area=0.0052 um2*(2.0e+06 A/cm$^2$)=104 uA; wherein
   uA represents micro amps
   RL=RA*MTJ_Area=6/0.0052=1153 Ohm
   RH=RL_2*2.5=2885 Ohm The size of each of the layers of each of the MTJs 13 and 21 are as follows:

In one embodiment of the present invention, the thickness of layer 14 is typically between 5 to 50 nm, and that of the layer 16 is between 0.6 to 2 nm, and that of the layer 18 is between 1.5 to 5 nm, and that of the layer 22 is between 5 nm to 50 nm, and that of the layer 24 is between 0.6 to 2 nm and that of the layer 26 is between 1.5 nm to 5 nm. The size ratio of MTJ 21 and MTJ 31 is between 1 and 3, i.e., the length and width of MTJ 21 is typically smaller than the length and width of MTJ 13, as stated earlier.

The thickness of the top electrode 28, in one embodiment of the present invention is between 20 nm and 200 nm and the thickness of the bottom electrode 12, in one embodiment of the present invention is between 20 nm and 200 nm.

The size of the middle electrode 20, in one embodiment of the present invention is 5 to 500 nm.

FIG. 25 shows the total resistance of the STTMRAM 10 with the STTMRAM 10 having the foregoing sizes/thicknesses/lengths/widths and the indicated logical states of: "00", "01", "10", "11". Total resistance refers to the collective resistance of the resistance of MTJ 13 and the MTJ 21. Thus, when the STTMRAM 10 is in logical state "00", its resistance is 3,448 Ohms and when it is in logical state "01", its resistance is 6,531 Ohms, and when it is in logical state "10", its resistance is 5,180 and when it is in logical state "11", its resistance is 8,263 Ohms.

As is known in the art, the fixed layer of each of the MTJs 13 and 21 has a magnetization direction that is fixed, as indicated in FIG. 25, under the column "Fix Layer", yet, the direction of magnetization of the free layers of each of the MTJs 13 and 21 change based on the level of switching current experienced by the MTJs. When the direction of magnetization of a free layer is substantially parallel to that of the fixed layer, this state is said to be "parallel" and when the direction of magnetization of a free layer is substantially anti parallel to that of the fixed layer, this state is said to be "anti-parallel". As expected, the logical state "00" in FIG. 25 results in the lowest resistance associated with the STTMRAM 10 because both free layers of the STTMRAM 10 are in "parallel" states and the logical state "11" results in the highest resistance associated with the STTMRAM 10 because both free layers of the STTMRAM 10 are in "anti-parallel" states.

Figure 2:
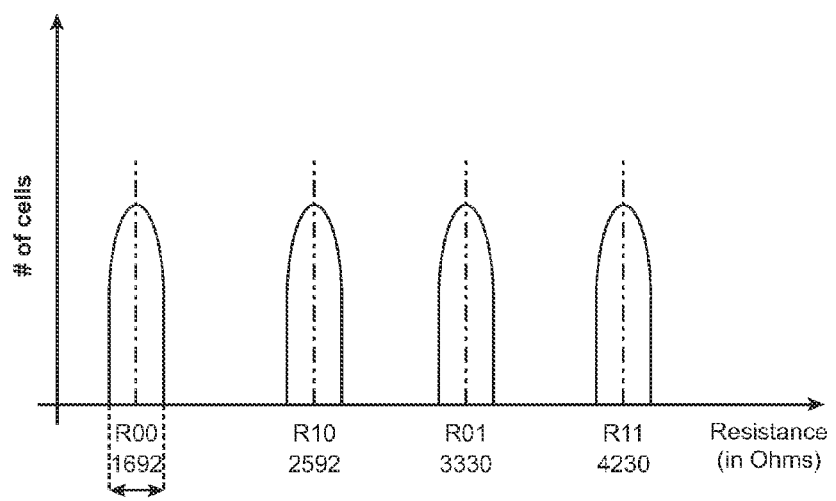
FIG. 2 shows a graph of the number of cells (shown by the y-axis) versus the total resistance of the STTMRAM 10 (shown in the x-axis) in accordance with FIG. 25.

FIG. 2 shows a graph of the number of cells (shown by the y-axis) versus the total resistance of the STTMRAM 10 (shown in the x-axis) in accordance with Table 1. As shown in FIG. 2, a Gaussian curve is constructed around each total resistance value indicating approximately 200 Ohm range of resistance around the total resistance within which the state of the STTMRAM 10 is declared to be that of the state shown in Table 1 with respect to the total resistance. For example, if the resistance of the STTMRAM 10 is anywhere from 3,348 to 3,548 ohms, the logical state of the STTMRAM 10 is written as "00". In FIG. 2, four total resistances, "R00", "R10", "R01", and "R11", with associated Gaussian curves, are shown, the four total resistances, R00, R10, R01, and R11 being 1692, 2592, 3330, and 4230 in Ohms, respectively.

Figure 3:
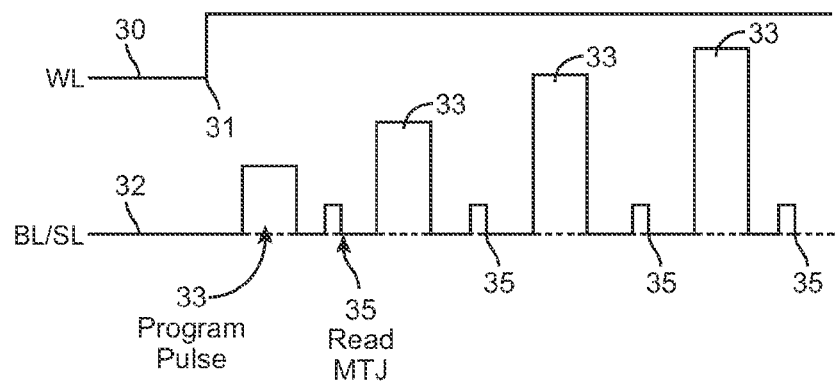
FIG. 3 shows a timing diagram of a word line (WL) signal 30 relative to a bit line(BL)/sense line (SL) signal 32 associated with the circuit diagram of FIG. 4.
Figure 4:
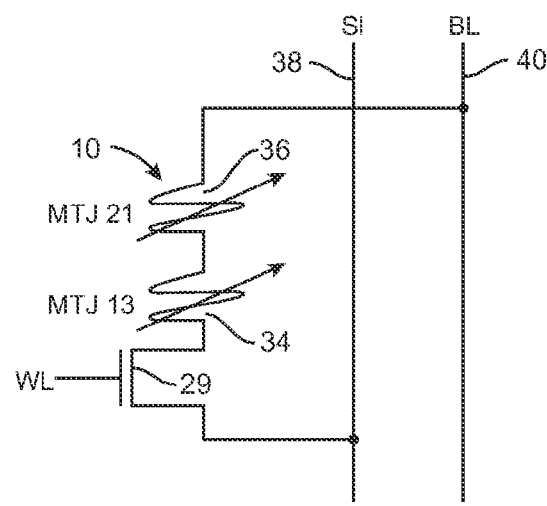
FIG. 4 shows the STTMRAM 10 represented by the variable resistors 34 and 36 shown coupled together in series.

FIG. 3 shows a timing diagram of a word line (WL) signal 30 relative to a bit line(BL)/sense line (SL) signal 32 associated with the circuit diagram of FIG. 4. FIG. 4 shows a representation of the STTMRAM 10 when it is coupled to circuitry for reading and writing the STTMRAM 10 in a memory array arrangement.

In FIG. 3, after WL signal 30 is enabled (at 31), pulses are applied to BL/SL signal 32 to program (or write) or erase STTMRAM 10 and depending on the size of the program/erase pulses being applied to BL/SL signal 32, a logical state is programmed into the STTMRAM or a particular logical state is erased. Program/erase pulses 33 are therefore shown as having different sizes in FIG. 3.

STTMRAM 10 is read when a read pulse 35 is applied thereto through the BL/SL signal 32. The BL/SL signal 32 senses the logical state retained by the STTMRAM 10 when the pulses 35 are applied assuming the WL signal 30 is enabled. When the WL signal 30 is not enabled (or disabled), pulses on the BL/SL signal 32 do not affect the STTMRAM 10. The MTJ 21 is programmed by changing the direction of current.

FIG. 4 shows the STTMRAM 10 represented by the variable resistors 34 and 36 shown coupled together in series. The resistor 34 represents the resistance taken on by the MTJ 13 and the resistor 36 represents the resistance taken on by the MTJ 21. In FIG. 4, the WL signal 30 is shown coupled to an access transistor 29, which is built on the same substrate as that which the STTMRAM is built. The WL signal 30 is shown coupled to the gate of the transistor 29. The source of the transistor 29 is shown coupled to the sense line (SL) 38 and the drain of the transistor 29 is shown coupled to one side of the MTJ 13 with an opposite side of the MTJ 29 being coupled to one side of the MTJ 21 and an opposite side of the MTJ 21 being coupled to BL 40. The steps performed for programming the STTMRAM 10 of FIG. 4 are shown in FIG. 5.

Figure 5:
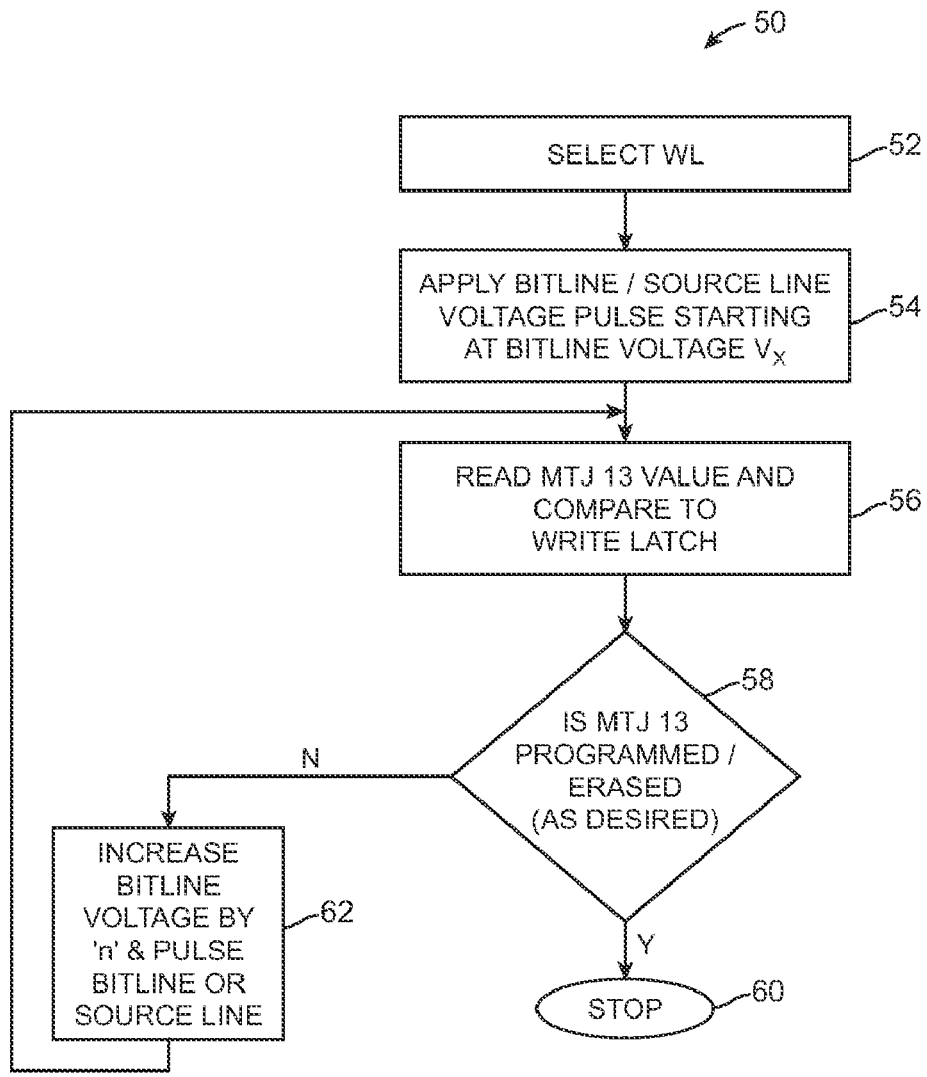
FIG. 5 shows a flow chart 50 of the steps performed when the STTMRAM 10 is being programmed in accordance with steps of the present invention.

FIG. 5 shows a flow chart 50 of the steps performed when the STTMRAM 10 is being programmed in accordance with steps of the present invention. At step 52, the WL signal 30 is selected (or enabled), next, at step 54, a pulse 33, which is a voltage pulse with a voltage of Vx, is applied to the BL/SL signal 32. Next, at step 56, MTJ 13 is read by detecting the resistance of MTJ 3 and a compare operation is performed comparing the read MTJ value to the value stored in a data register, as will shortly be further evident.

Next, at 58, a determination is made as to whether or not the MTJ 13 is programmed or erased, as the case may be and if the outcome of the determination is positive, the process stops at 60, otherwise, the process proceeds to step 62 where the voltage of the pulse 33 on the BL/SL signal 32 is increased by 'n', 'n' being a real number. After step 62 is completed, the process proceed to and continues from step 56 where the steps 56-62 are repeated in the manner discussed above until the desired programming or erase level is reached.

Figure 6:
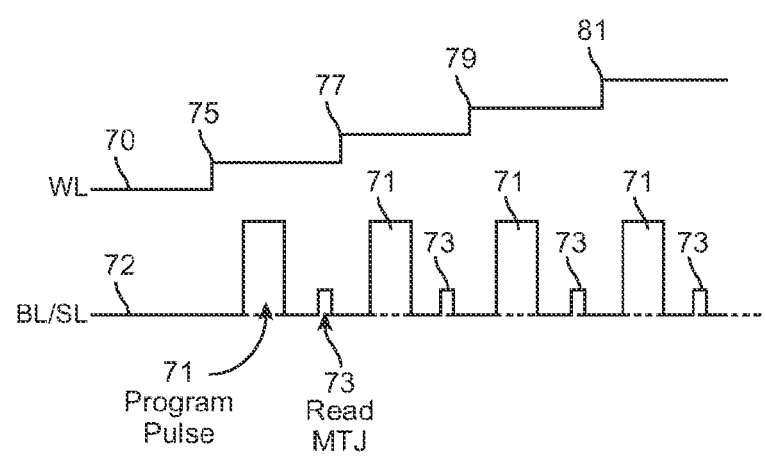
FIG. 6 shows a timing diagram of a WL signal 70 relative to a BL/SL signal 72 associated with the circuit diagram of FIG. 4.

FIG. 6 shows a timing diagram of a WL signal 70 relative to a BL/SL signal 72 associated with the circuit diagram of FIG. 4. The timing diagram of FIG. 6 is also intended to represent the behavior of some of the signals used in FIG. 4, as did the timing diagram of FIG. 3.

In FIG. 6, the WL signal 70 does not take on two voltage levels, as did WL signal 30 in FIG. 3, rather, the WL signal 70 takes on more than two voltage levels and with each voltage level change, as denoted at 75, 77, 79 and 81, a program or erase pulse is applied to the BL/SL 71 to cause programming or erasing, as the case may be, of the STTMRAM 10. Each voltage level increase adds to the voltage level of the WL signal 70 by 'n'. The voltage level at a particular level is represented by Vwl.

Figure 7:
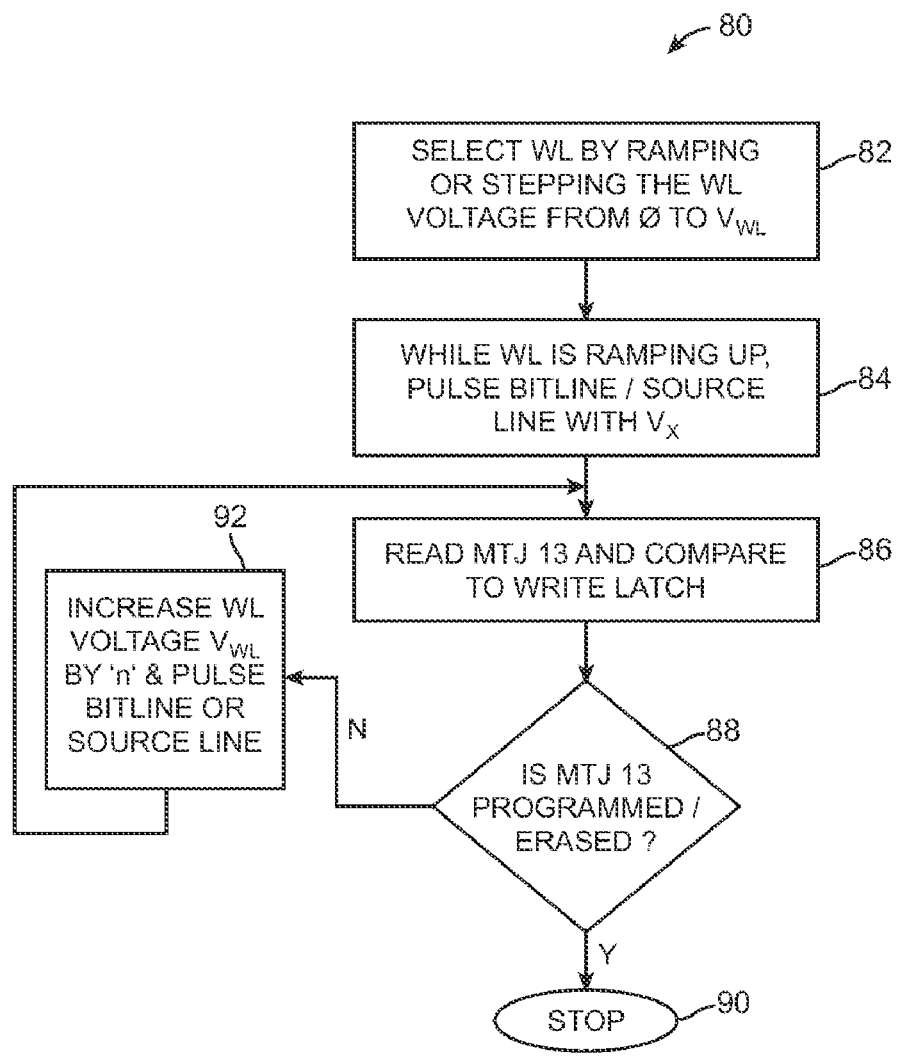
FIG. 7 show a flow chart 80 of the steps performed for programming the SSTMRAM 10 when the signals WL 70 and BL/SL 72 behave as shown in FIG. 6.

In accordance with another method of the present invention, FIG. 7 show a flow chart 80 of the steps performed for programming the SSTMRAM 10 when the signals WL 70 and BL/SL 72 behave as shown in FIG. 6. At step 82, WL signal 70 is selected or enabled, shown at 75 in FIG. 6, by ramping or stepping up the WL signal's voltage level from approximately 0 volts to Vwl. Thereafter, at step 84, while WL signal 70 is ramping up, the BL/SL signal 72 is pulsed with Vx.

Next, at step 86, the MTJ 13 of the SSTMRAM 10 is read and compared to the write latch. Next at 88, a determination is made as to whether or not the MTJ 13 is programmed or erased, as desired, and if the MTJ 13 is determined to have been programmed or erased, the process stops at 90, otherwise, the process continues to step 92 where the voltage level of the WL signal 70 is increased by 'n' resulting in a voltage level of Vwl+n, at for example 77 in FIG. 6, and another program/erase pulse 71 is applied to the BL/SL signal 72 and the process continues to step 86 and repeats steps 86 through 92 until at 88, it is determined that the MTJ 13 has been programmed. The MTJ 21 is programmed the same way.

As in FIG. 3, voltage pulses 73, smaller than the voltage pulses 71 are applied to BL/SL signal 72 for reading the STTMRAM 10. The read pulse 73 is not mistaken for the write pulse 71 because the size or amplitude of the voltage pulse of one varies sufficiently enough to avoid such a mistake.

It is noted that while the voltage pulses applied to the BL/SL signal 32 of FIG. 3 are at different levels, the voltage pulses of the BL/SL signal 102 of FIG. 6 are at substantially the same voltage level. From a design perspective, the embodiment of FIG. 6 is less complex and therefore less expensive to manufacture.

Figure 8:
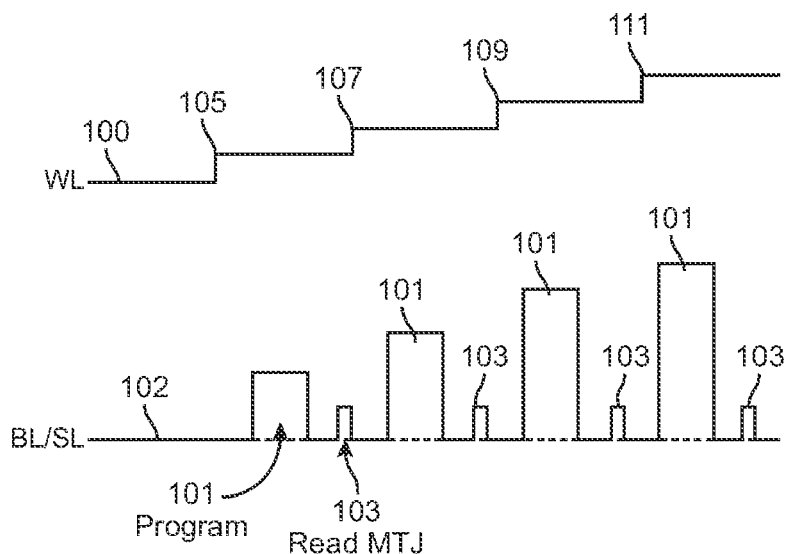
FIG. 8 shows a timing diagram of a WL signal 100 relative to a BL/SL signal 102 associated with the circuit diagram of FIG. 4.

FIG. 8 shows a timing diagram of a WL signal 100 relative to a BL/SL signal 102 associated with the circuit diagram of FIG. 4. The timing diagram of FIG. 8 shows a behavior of WL and BL/SL signals that is a hybrid of the corresponding signals of FIGS. 3 and 6 in that the WL signal 100 ramps up, in an analogous manner to the WL signal 70 but the BL/SL signal 102 pulses at different levels analogous to the BL/SL signal 32.

The steps performed for programming or writing to the SSTMRAM 10 using the behavior of the signals shown in FIG. 8 are the same as those shown in FIG. 7 except that after step 92 and before the step 86, in FIG. 7, the BL/SL signal 102 of FIG. 8 pulses at a voltage that is Vx+n (pulses 101). Read operations are performed in the same manner described above with read pulses 103 applied to the BL/SL signal 102.

Figure 9:
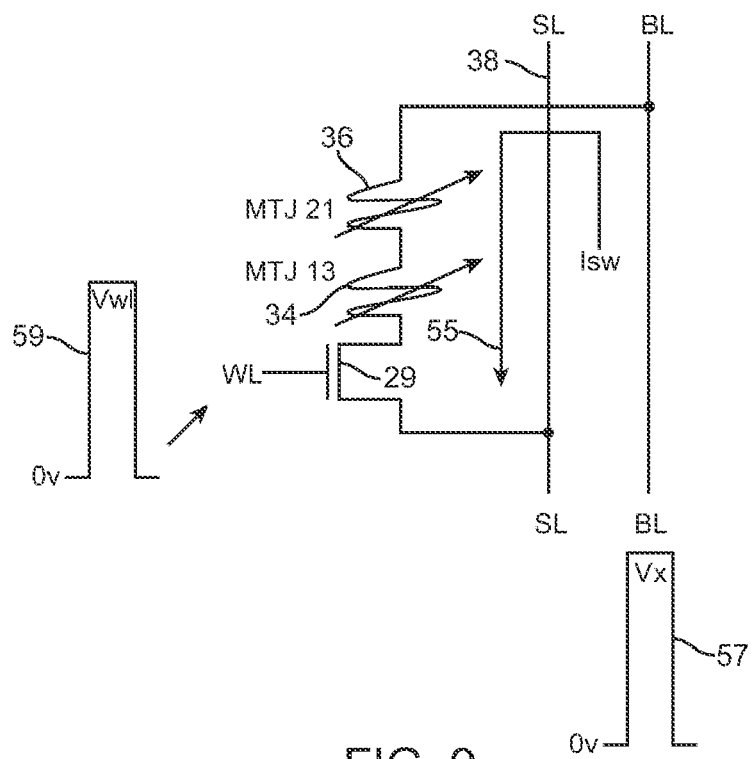
FIG. 9 shows a circuit for programming one of the MTJs of the STTMRAM 10 from an anti-parallel state to a parallel state (RH to RL or "1" or "0").

FIG. 9 shows a circuit for programming one of the MJN of the STTMRAM 10 from an anti-parallel state to a parallel state (RH to Rt or "1" or "0"). A voltage pulse 59, shown in FIG. 9 between 0v to Vwl, is applied to the WL signal 30 and a voltage pulse 57, shown in FIG. 9 between 0V to Vx, is applied to the BL signal 32. The switching current (lsw) 55 is shown flowing in a counter-clockwise direction through the BL signal 32, the MTJ 21, the MU 13, the access transistor 29 and to the signal 38.

Figure 10:
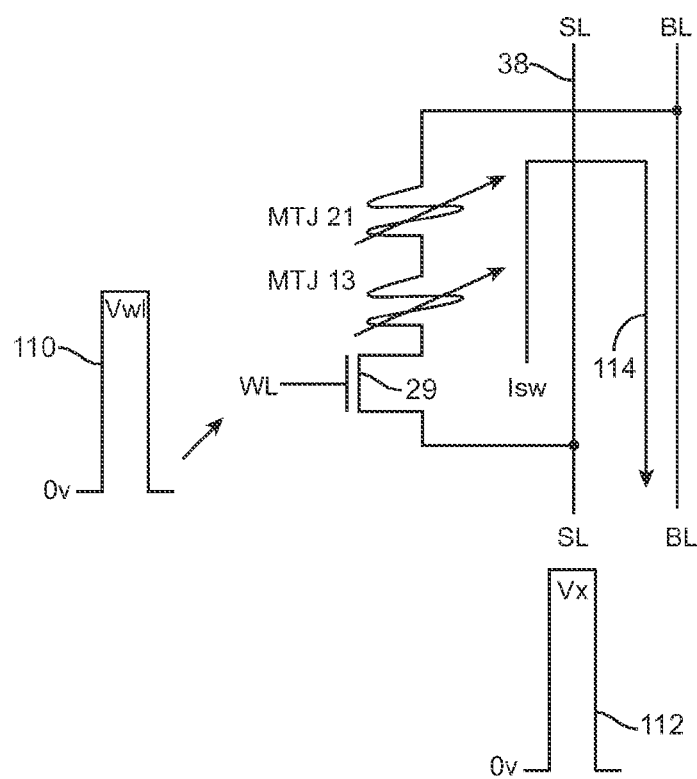
FIG. 10 shows a circuit for programming one of the MTJs of the STTMRAM 10 from an parallel state to an anti-parallel state (RL to RH or "0" or "1").

FIG. 10 shows a circuit for programming one of the MTJs of the STTMRAM 10 from an parallel state to an anti-parallel state (RL to R11 or "0" or "1"). A voltage pulse 110, shown in FIG. 10 between 0v to Vwl, is applied to the WL signal 30 and a voltage pulse 112, shown in FIG. 10 between 0v to Vx, is applied to the BL signal 32. The switching current (lsw) 55 is shown flowing in a clockwise direction through the SL signal 112, through the access transistor 29, through the MTJ 13, through the MTJ 21 and to the BL signal 32.

Figure 11:
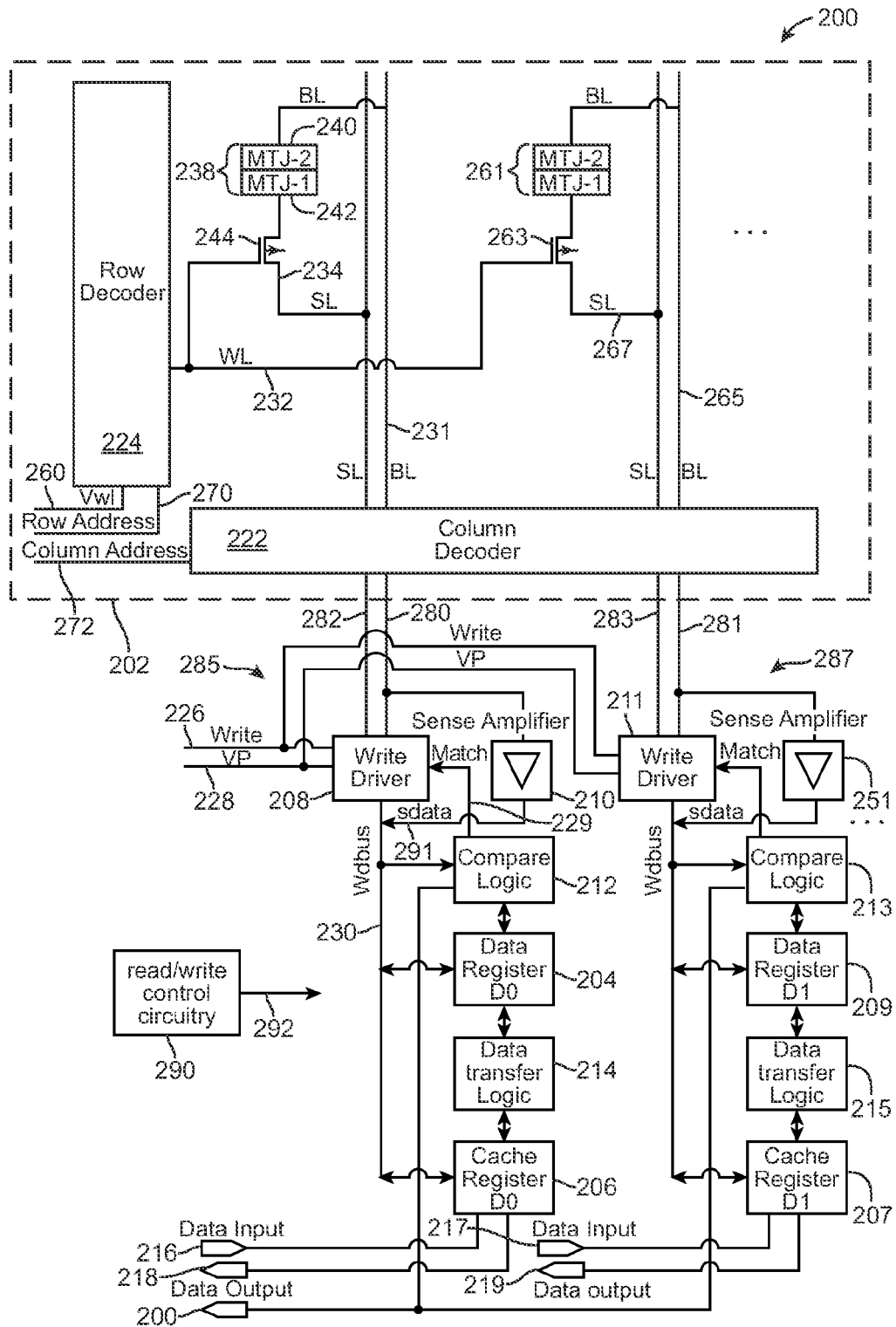
FIG. 11 shows a block diagram of magnetic memory system 200, in accordance with an embodiment of the present invention.

FIG. 11 shows a block diagram of a magnetic memory system 200, in accordance with an embodiment of the present invention. The memory system 200 is shown to include a magnetic memory array 202, a plurality of data registers D0 204 and D1 209, a plurality of cache registers D0 206 and D1 207, a plurality of data transfer logic 214 and 215, a plurality of write drivers 208 and 211, a plurality of compare logic 212 and 213, a read/write control circuitry 290 and a plurality of sense amplifiers 210 and 251.

The read/write control circuitry 290 generates control signals 292 and while not shown for the sake of brevity, the control signals 292 couple to the various structures of the magnetic memory systems 200, such as the compare logics, the data registers, the data transfer logic, the cache registers and the write drivers.

It is noted that the memory system 200 is typically a self-contained semiconductor or integrated circuit device although in various systems, it may be physically formed on more than one integrated device or on a device other than an integrated circuit. For the purposes of the discussion to follow, it will be presumed that the memory system 200 is a single integrated circuit.

The memory array 202 is shown to include a row decoder 224, a column decoder 222, a set of MTJs 238, an access transistor 244, a set of MTJs 261 and an access transistor 263. Each access transistor corresponds to a set of MTJs. While two sets of MTJs and their corresponding access transistors are shown included in the memory array 202, it is understood that the memory array 202 may include any suitable number of sets of MTJs and corresponding access transistors.

The row decoder 224 is shown to receive a word line voltage (Vwl) 260 and a row address 270 and is operative to generate a word line 232, which is shown coupled to the gate of each of the access transistors 244 and 263. The column decoder 222 is shown to receive a column address 272, a write driver bit line (BL) 280, a write driver BL 281, a sense line (SL) 282 and a SL 283 and is operative to generate a BL 231, a BL 265, a SL 232 and a SL 267. Again, it is understood that typically, with the inclusion of more than two sets of MTJs in the memory array 202, the column decoder 222 receives more than two sets of write driver BLs and SLs and generates more than two sets of BLs and SLs.

The set of MTJs 238 is shown to include an MTJ 240 and an MTJ 242, which are coupled together in series. Similarly, the set of MTJs 261 is shown to include two MTJs coupled together in series. The MTJ 242 of the set of MTJs 238 is shown coupled to the drain of the access transistor 244. The MTJ 240 of the set of MTJs 238 is shown coupled to the BL 231. The source of the transistor 244 is shown coupled to the SL 234. The BL 265 and SL 267 are shown coupled to the set of MTJs 261 much in the same way as the coupling of the BL 231 and SL 234 to the set of MTJs 238. More specifically, the set of MTJs 261 is shown coupled on one side to the drain of the access transistor 263 and on another end to the BL 265 and the SL 267 is shown coupled to the source of the access transistor 263.

The row decoder 224 functions to activate, or not, the WL 232, based on the value of the row address 270 and the Vwl 260, to select one of the two MTJs of a set of MTJs. The column decoder 222 functions to activate one of the BL and SLs depending on which set of MTJ is selected based on the value of the column address 272 and the write driver BL 280 and the write driver SL 282. The function of the access transistors, such as the access transistor 244 and the access transistor 263, is readily known to those skilled in the art. Briefly, the access transistors serve to address, select or identify a corresponding MTJ for reading of or writing to the MTJ.

Each of the MTJs of a set of MTJs functions as a variable resistor and the total resistance of a set of MTJs is the combined resistance of the resistance of each of the MTJs of the set. During manufacturing, each of the MTJs of a set of MTJ is made with a different or unique resistance or a different or unique TMR thereby causing the set of MTJ to have four distinct resistance values for storing two bits of information, as shown in FIG. 25. As will be evident shortly, application of a unique voltage range causes a unique current range to flow through the set of MTJs and invoke reading and writing of one or both of the MTS of the set. For this reason, the state of the MTJ of a set of MTJs that is not intended to be programmed is first preserved before the other one of the MTJs of the set (one that is intended on being programmed is programmed).

A read/write circuitry logic is associated with and intended for writing and reading of a corresponding set of MTJs. For example, the cache register D0 206, the data transfer logic 214, the data register D0, the compare logic 212, the write driver 208 and the sense amplifier 210 (collectively referred to as read/write circuitry 285) are coupled to and intended to write to and read the set of MTJs 238, whereas the cache register D1 207, the data transfer logic 215, the data register D1 209, the compare logic 213, the write driver 211 and the sense amplifier 251 (collectively referred to as read/write circuitry 287), are coupled to and intended to write to and read the set of MTJs 261. It is understood that while the magnetic memory system 200 is shown to include two sets of MTJs and corresponding read/write circuitry, any number of sets of MTJs and corresponding read/write circuitry may be employed.

Referring still to FIG. 11, the cache register D0 206 is shown to receive in-coming data 216 during a write or program operation and to generate an output data 218 during a read operation. Similarly, the cache register D1 207 is shown to receive in-coming data 217 during a write or program operation and to generate an output data 219 during a read operation. The cache register D0 206 is further shown coupled to a write driver bus (Wdbus) 230 and to the data transfer logic 214. The data transfer logic 214 is shown further coupled to the data register D0 204, which is shown coupled to the compare logic 212 and the Wdbus 230. In an alternative embodiment, shown and discussed relative to a subsequent figure, the data transfer logic 214 is absent.

The compare logic 212 is shown coupled to the Wdbus 230 and is shown operative to generate a match signal 229 and a fail signal 220. The fail signal 220 causes coupling of all of the compare logics of the read/write circuitry in that the match signal 229 of each of the read/write circuitry is wire-ORed to generate the fail signal 220. Wire-ORed circuits are well known to those skilled in the art.

The sense amplifier 210 is shown responsive to the write driver BL 280 and in this manner is coupled to the write driver 208 and is further shown to generate a sense data (sdata) for coupling onto the Wdbus 230.

The write driver 208 is shown responsive to a programming voltage level (Vp) 228 and a write signal 226 and is further shown to generate the write driver BL 280 and the write driver SL 282 and in this manner is coupled to the column decoder 222. The write driver 208 is further shown responsive to the match signal 229 and is shown coupled to the Wdbus.

Each of the cache registers and each of the data registers can be any kind of volatile memory, such as but not limited to a latch, a flip flop, a register, static or dynamic memory.

While the functions of the structures comprising the read/write circuitry 285 are discussed in detail with reference to the operation of the system 200 hereinbelow, a brief discussion follows. The read/write control circuitry 290, through the control signals 292, controls certain circuits and registers, such as the compare logic 212, the data register D0 204, the write driver 208 and the cache register D0 206 particularly with respect to arbitration of the Wdbus 230 in terms when and which circuit gains and loses access to the bus. The read/write control circuitry 290, in a similar manner, controls the read/write circuitry 287 and all other similar read/write circuitry. While not all signals included in the control signals 292 are shown in FIG. 11, the control signals 292 includes the write signal 226 and in this manner dictates when the write driver 208 drives the write driver BL 280 and the write driver SL 282.

The cache register D0 initially stores the in-coming data 216 and later, through the data transfer logic 214, swaps the in-coming data 216 with the data that was read from one of the MTJs of the set of MTJs 238 that is not intended to be programmed. The swap is actually between the cache register D0 206 and the data register D0 204 upon initiation by the data transfer logic 214. Subsequently and upon completion of a write operation, the contents of the cache register D0 206 and the data register D0 204 are again swapped allowing re-storage of the original contents of the MTJ that was not intended to be programmed. The latter swap is also initiated and caused by the data transfer logic 214. Thus, the function of the data transfer logic 214 is to swap the data of the cache register D0 206 and the data register D0 204.

The compare logic 212 compares the data in the data register D0 204 to the sdata 291 through the Wdbus 230 and under the control of the control signals 292. The arbitration of the Wdbus 230 is performed by the read/write control circuitry 290 through the control signals 292. The compare logic 212 further functions to indicate a match between its comparisons and reports the same through the match signal 229.

The write driver 208 functions to apply Vp 228 and its increments to the set of MTJs 238 during programming and also, upon activation of the write signal 226, which is a part of the control signals 292, the write driver 208 functions to drive or activate the write driver BL 280 and write driver SL 282. Furthermore, the write driver 208 uses the fail signal 220 to effectively disconnect itself, or not, from the remaining read/write circuitry, as will become evident shortly.

The coupling and function of the read/write circuit 287 is analogous to that of the read/write circuitry 285 discussed hereinabove, thus a discussion of the former is avoided for the sake of brevity.

For the purpose of discussing programming of an MTJ, one of a number of cache registers, data transfer logics, data registers and write drivers will be referenced. Namely, the cache register D0 206, the data transfer logic 214, the data register D0 204 and the write driver 208 will be referenced. The foregoing are the circuits used to program the set of MTJs 238. It is understood that programming of the remaining set of MTJs of the array 202 is performed in the same manner but obviously using a different and corresponding set of circuits. A replica of the foregoing circuitry or logic is used to program In operation, during a write or program operation, in-coming data 216, which is binary data ('1' or '0' being represented by a bit) to be written into a MTJ, is received by the memory system 200 and provided as input to the cache register 206. During a read operation, the cache register 206 is operative to generate the data output 218 when data is read from the set of MTJs 238.

During a write operation, the cache register 206 saves or stores the in-coming data 216. The sense amplifier 210 reads the content of the MTJ among the MTJs of the set of MTJs 238 that is to remain un-programmed. For the sake of discussion, it is presumed that the MTJ to be programmed is the MTJ 242 and the MTJ that is to maintain its contents and not be affected by the foregoing write (or program) operation, is the MTJ 240. The sense amplifier 210 reads the MTJ 240 for preservation and such reading is performed using techniques readily known to those skilled in the art. A brief summary of the manner used to read an MTJ is provided.

Each of the MTJs 240 and 242 of the set of MTJ 238 is read by a comparison of their respective resistance to reference resistors. As the resistance of an MTJ is variable and generally changes based on its magnetic state, reference resistors are employed to detect the resistance of an MTJ—the resistance of the MTJ is indicative of the state thereof. The magnetic state of an MTJ, i.e. parallel or anti-parallel with a high resistance (Rh) or that resistance typically experienced by a MTJ when it has an anti-parallel magnetic orientation and a low resistance (Rl) or that resistance typically experienced by a MTJ when it is in a parallel magnetic orientation typically dictate the value of the resistance values of the reference resistors, which are coupled in parallel to the MTJ being read. That is, typically, the value of a reference resistor is approximately the average of Rh and Rl. For a more detailed discussion of the read circuit and operation of an MTJ, the reader is directed to U.S. patent application Ser. No. 11/678,515, filed on Feb. 23, 2007, by Ranjan et al. and entitled "A High Capacity Low Cost Multi-State Magnetic Memory".

It is noted that during a write operation, a voltage level corresponding to the MTJ being programmed within a set of MTJs is applied to the WL 232 by the row decoder 224. In the example used above to discuss programming relative to FIG. 11, a predetermined voltage level associated with WL 232 corresponds to programming the MTJ 240 of the set of MTJs 238 and another predetermined voltage level, preferably not overlapping with the former predetermined voltage level, corresponds to programming the MTJ 242 of the set of MTJs 238. As an example, such as shown in FIG. 26 herein, a voltage level range of 1.2 Volts (V) to 1.4V corresponds to programming of the MTJ 240 where a voltage within this range, when applied to the WL 232, activates or identifies the MTJ 240, and a voltage level within the range of 1.4V to 1.8V corresponds to programming of the MTJ 242 by activating the MTJ 242.

Referring now back to the discussion of a write operation, the sense amplifier 210 reads and stores the value of the MTJ 240. The stored value of the MTJ 240 is ultimately preserved in the cache register D0 206 until the write operation to the MTJ 242 is completed after which the contents of the cache register 206 is transferred to the data register D0 204 and written back into the MTJ 240. To preserve the value of the MTJ 240 into the cache register D0 206, the sense amplifier 210 transfers the read and stored value of the MTJ 240 to the data register D0 204, then, the transfer logic 214 swaps the contents of the data register D0 204 and the cache register D0 206 such that the in-coming data ends up in the data register D0 204 and the data to be preserved (contents of the MTJ 240) ends up in the cache register D0 206. Stated differently, upon the storage of the data that is in the MTJ 240 into the data register D0 204 and the storage of the in-coming data 216 into the cache register D0 206, the data transfer logic 214 causes these two values to be swapped with the in-coming data 216 being stored by the data register D0 204 and the cache register D0 206 storing the value of the MTJ 240. Accordingly, the state (or content) of the MTJ 240 is saved in the cache register D0 206 and the MTJ 240 may be over-written without concern for losing its data.

By way of further clarification, the MTJs 240 and 242 are coupled together in series, such as the other sets of MTJs shown in various embodiments of the present invention herein. One of the set of MTJs, in the case of FIG. 11, MTJ 242, requires a lower programming voltage level to switch logic states than the other MTJ of the set, in the case of FIG. 11, the other MTJ being MTJ 240, and as such, when programming or writing to MTJ 240, or the MTJ that requires a higher programming voltage level, the other MTJ, in this case, MTJ 242 is likely to be undesirably affected and its contents over-written. This necessitates the preservation of the logic state of the MTJ that requires lower programming voltage level, in the case of FIG. 11, MTJ 242, prior to programming of MTJ 240 and then restoration of the logic state of MTJ 242, after programming of the MTJ 240.

Figure 20:
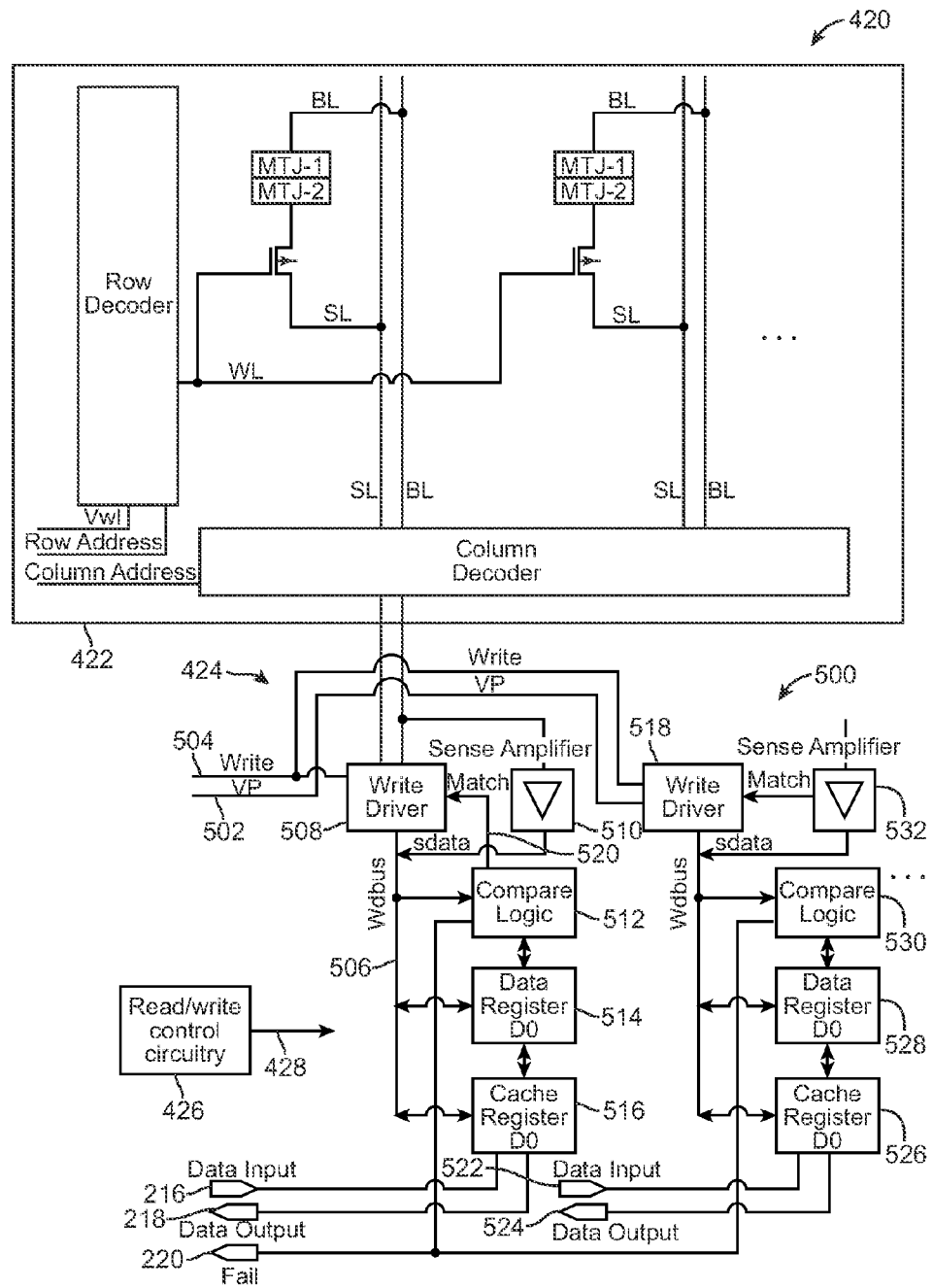
FIG. 20 shows a magnetic memory system 420, in accordance with an embodiment of the present invention.
Figure 21:
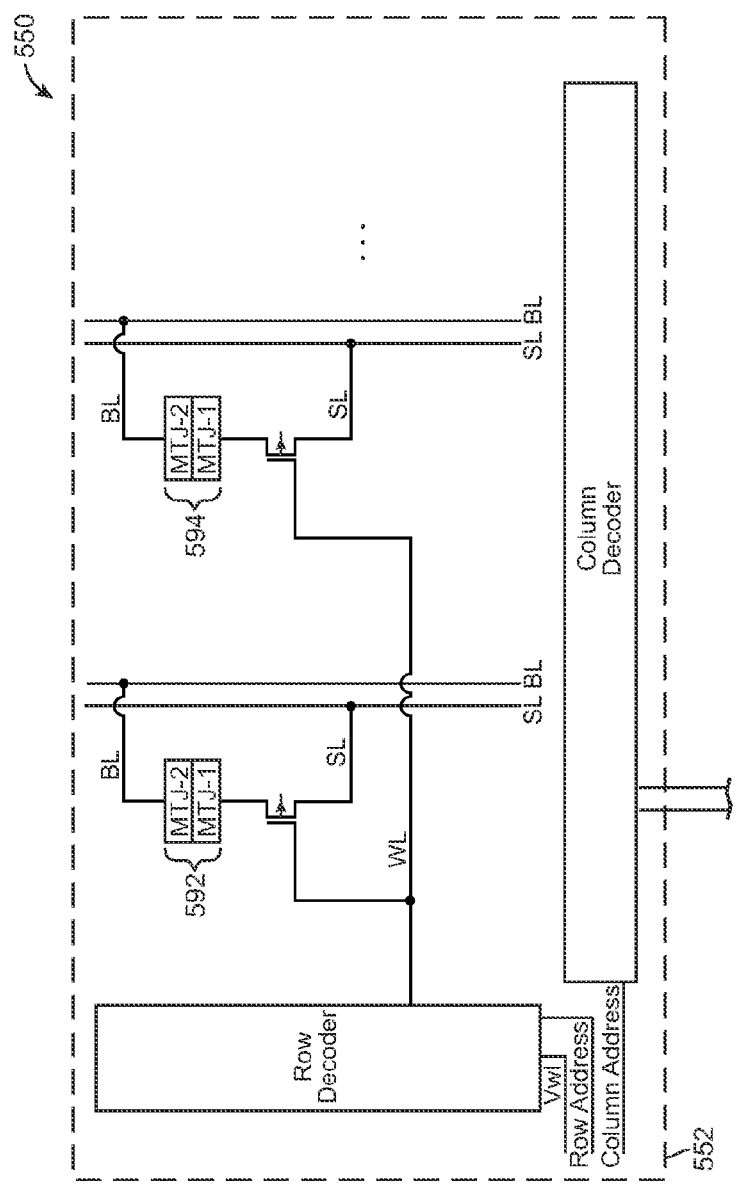
FIG. 21 shows a magnetic memory system 550, in accordance with yet another embodiment of the present invention.
Figure 21:
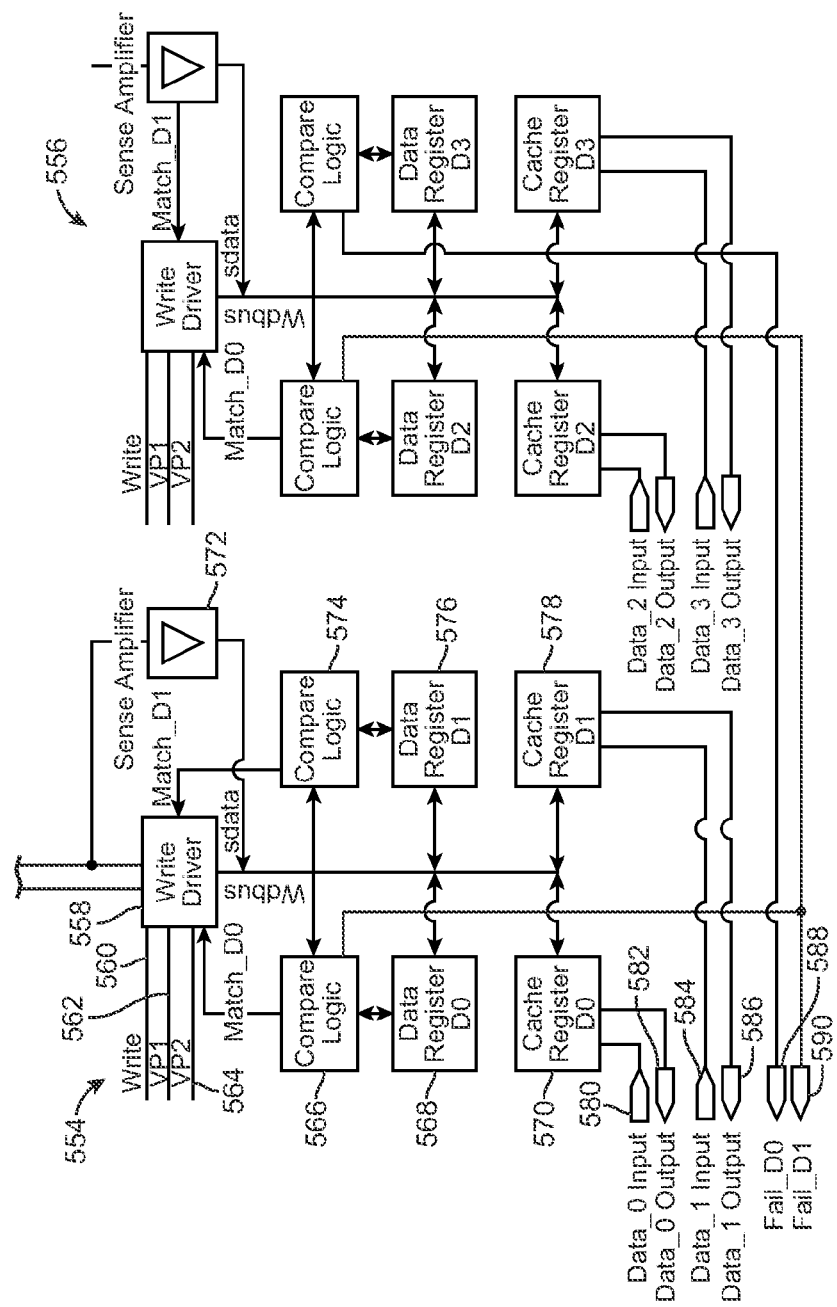

In an alternate embodiment, such as shown in FIGS. 20 and 21, no transfer logic 214 is required, rather, the contents of the cache register and the data register are swapped through the use of a bus coupling these two and other circuitry.

It is noted that a write or program operation, as referred to herein with respect to FIGS. 11-24 refers to the BL and SL being driven or activated by a suitable current flowing therethrough to cause programming of the MTJ.

Next, a programming voltage, Vp, is applied by the write driver 208 to the bit line (BL) 231 and the sense line (SL) 234. Initially, the value Vp is the lowest of a range of voltages assigned to program the MTJ 242. That is, each of the MTJs of the set of MTJs 238 has a predetermined assignment of voltage level ranges to which the MTJ responds and stores a value (or changes its magnetic orientation). This however, does not necessarily guarantee that the MTJ that is not being programmed remains safely un-erased. Thus, the contents of the MTJ that is to remain unaffected by programming of the other MTJ in the set may and is likely to be erased when the Vp is applied to the set of MTJs 238 by the write driver 208. Even if the initial value of Vp 228 does not affect the MTJ that is not being programmed, incremental values of Vp 228 are likely to have such an effect. That is, as will become apparent shortly, the value of Vp 228 most often changes when an MTJ is being programmed. Initially, it is at its lowest value but when programming of the MTJ is not successfully by the application of the initial Vp value, Vp is incremented by a predetermined value and applied again. An exemplary table of ranges of values for Vp 228 is shown in FIG. 26.

FIG. 26 shows an example of the voltage levels of the BL, WL and SL during a write operation to the MTJs of the set of MTJs 238. In FIG. 26, the first column from the left side of the page includes the write operation to a particular MTJ, such as the MTJ 240 or the MTJ 242, and the next column over shows the range or value of the voltage that the WL signal 232 takes on when writing to a particular MTJ, such as shown to be 1.2V to 1.4V for when writing to the MTJ 240 and 1.4V to 1.8V for when writing to the MTJ 242, and the next column over shows the range or value of the voltage taken on the BL 231, such as shown to be 0.5V to 0.7V when writing "0" to MTJ 240 and 0 when writing "1" to MTJ 240 and 0.7V to 1.2V when writing "0" to MTJ 242 and 1.4V to 1.8V when writing "1" to MTJ 242, and the last column shows appearing as the first column from the left side of the page, the range or value of the voltage taken on by the SL 232 during programming is reflected as being 0 when writing "0" to the MTJ 240, 0.5V to 1.2V when writing "1" to the MTJ 240, 0 when writing "0" to the MTJ 242 and 0.7V to 1.2V when writing "1" to the MTJ 242. For example, to program the MTJ 242 to a logic value of '0', WL 232 is set by the row decoder 224 initially to 1.2 volts (V) and incremented up to 1.8V or until programming is accomplished but MTJ 242 should not need a value higher than approximately 1.8V to be programmed. Also, to program the MTJ 242 to logic state '0', BL 231 is set to 0.7V initially and the voltage level is incremented from 0.7V to a next incremental value, such as 0.8V, up to 1.2V or until programming is accomplished. SL 232 is set to approximately 0V. Programming of other values or the MTJ 240 is similarly accomplished with the values shown in FIG. 26. It is worthy to note that the voltage level applied to WL 232 is the same no matter which MTJ and which value are being programmed but the voltage level values applied to BL and SL change depending on which MTJ and state is being programmed. Also, there is an overlap in the voltage level ranges between the MTJ 240 and the MTJ 241. For example, BL 231 carries a voltage level range for programming the MTJ 240 that overlaps in part with the range associated with programming of the MTJ 242. For this reason, in one embodiment of the present invention, the MTJ that is not to be programmed may be affected by the MTJ intended to be programmed, thus, requiring the contents of the former to be preserved during programming of the latter and later written back into the former. It is noted that the values provided in FIG. 26 are merely examples of the voltage level assigned to each MTJ and that in various embodiments other voltage level ranges and values may be employed.

After the application of Vp 228 to the set of MTJs 238 by the write driver 208, the value of MTJ 242 is read and saved by the sense amplifier 210 although in alternative embodiments, the value read need not be saved and can be merely read. The read value is referred to as sdata "292" in FIG. 11 and is compared, by the compare logic 212, to the value saved in the data register D0 204. In essence, the value programmed into the MTJ 242 is compared to the in-coming data and if the result is an unsuccessful comparison with the two values not being identical, the compare logic 212 announces 'no match' by activating/deactivating (depending on the polarity used for the match signal 229) the match signal 229. If however, the match is successful, the match signal 229 is programmed by the compare logic 212 to indicate so accordingly and the write driver 208 is disallowed from altering the voltage level on the BL 231 or the SL 232 and the write operation ends.

Upon an unsuccessful match however, the value of Vp 228 is incremented by a predetermined amount and the incremented Vp is applied to the BL and SL by the write driver 208 and used to alter the state of the MTJ 242 in the manner discussed above. This process continues until a match is found between the value saved in the data register D0 204 and the sdata 292. However, each time no match is detected, the fail signal 220 is activated by the fail signal 220 and once a match is detected, the fail signal 220 is inactivated to indicated that there is no further failed matches, thereby effectively invoking disconnection of the write driver 208 from the remaining sets of MTJs, the remaining sets of MTJs being those sets, other than the set of MTJs 238, that are being programmed at the same time the MTJ 242 is being programmed. A more detailed discussion of the foregoing programming of the rest of the sets of MTJs is shown in and discussed relative to a subsequent figure.

Upon completion of programming of the MTJ 242, the contents of the data register D0 204 and the cache register D0 206 are swapped again, by the data transfer logic 214 in those embodiments where a transfer logic is employed and without the data transfer logic 214 in those embodiments where the latter is absent, with the data register D0 ending up with the value that was initially stored in and read from the MTJ 240. That is, MTJ 240's original contents are preserved. After the foregoing swapping and upon completion of programming of MTJs of like-locations of the remaining sets of MTJs, another write operation is performed, in a manner analogous to the foregoing write operation, to write the value in the data register D0 204 into the MTJ 240 thereby restoring the MTJ 240 through the write driver 208.

Figure 12:
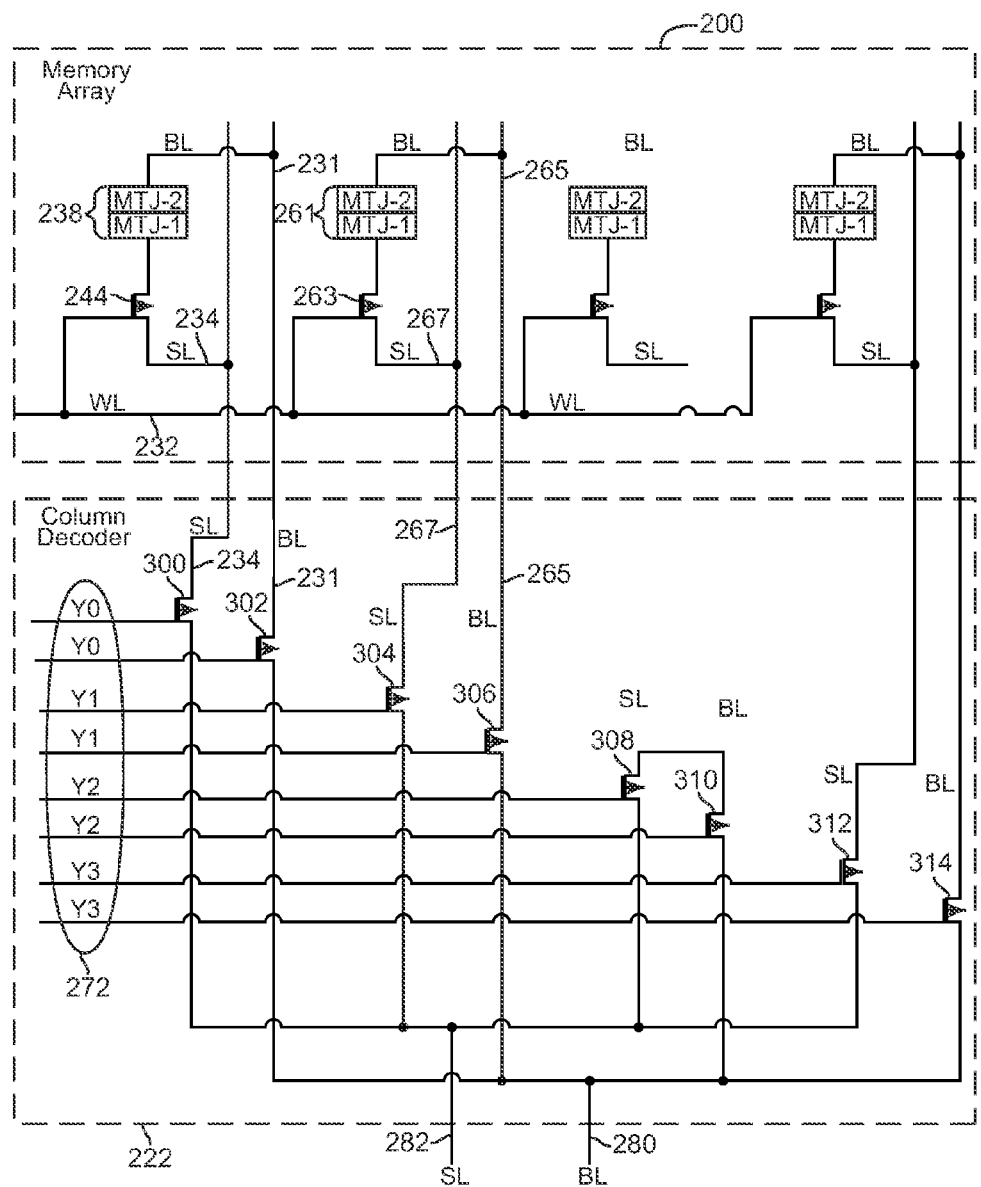
FIG. 12 shows further details of the column decoder 222, in accordance with an embodiment of the present invention.

FIG. 12 shows further details of the column decoder 222, in accordance with an embodiment of the present invention. It is noted that further details of the row decoder 224 are not shown herein because the structure row decoder 224 is analogous to that of the column decoder 222 except that signals being received by the former are different as shown in FIG. 11.

In FIG. 12, the column decoder 222 is shown to include a number of transistors 300-314, with each transistor essentially serving as a switch to activate a SL or a BL, or to deactivate the same, based on the value of the column address 272. More specifically, the column address 272 is shown, as an example, to include four signals, Y0-Y3, with each signal being coupled to the gate of each of two transistors among the transistors 300-314. The signals Y0-Y3 are generated by a pre-decoder (not shown) in the column decoder 222, which is readily known to those of skill in the art. It is noted that the signals Y0-Y3 are four signals with each signal have a common name being the same signal even though it is shown as a separate line. For example, while two Y0 signals are shown in FIG. 12, this is actually the same signal.

In an exemplary embodiment, the signal Y0 is shown coupled to the gate of the transistor 300 and to the gate of the transistor 302. The signal Y1 is shown coupled to the gate of the transistor 304 and the gate of the transistor 306 and so on. The drain of each of the transistors 300, 304, 308 and 312 is shown coupled to a corresponding SL and the drain of each of the transistors 302, 306, 310 and 314 is shown coupled to a corresponding BL. For example, the drain of the transistor 300 is shown coupled to the SL 234, the drain of the transistor 304 is shown coupled to the SL 267 and so on. Similarly, the drain of the transistor 302 is shown coupled to the BL 231 and the drain of the transistor 306 is shown coupled to the BL 265 and so on. The source of each of the transistors 300, 304, 308 and 312 is shown coupled to the write driver SL 282 and the source of each of the transistors 302, 306, 310 and 314 is shown coupled to the write driver BL 280.

Each of the signals Y0-Y3 along with each of the signal write driver SL 282 cause one of the transistors 300, 304, 308 and 312 to turn on and each of the signals Y0-Y3 along with the signal write driver BL 280 cause the one of the transistors 302, 306, 310 and 314 to turn on. The pair of SL-BL transistors that is turned on causes the write driver SL 282 and the write driver BL 280 to be coupled to a respective SL and BL enabling the reading of or writing to a corresponding set of MTJs. For example, when transistors 300 and 302 are turned on, the write driver SL 282 is directly coupled to the SL 234 and the write driver BL 280 is directly coupled to the BL 231 thereby enabling reading of or writing to the set of MTJs 238. In this manner, the transistors 300-314 function as switches.

Figure 13:
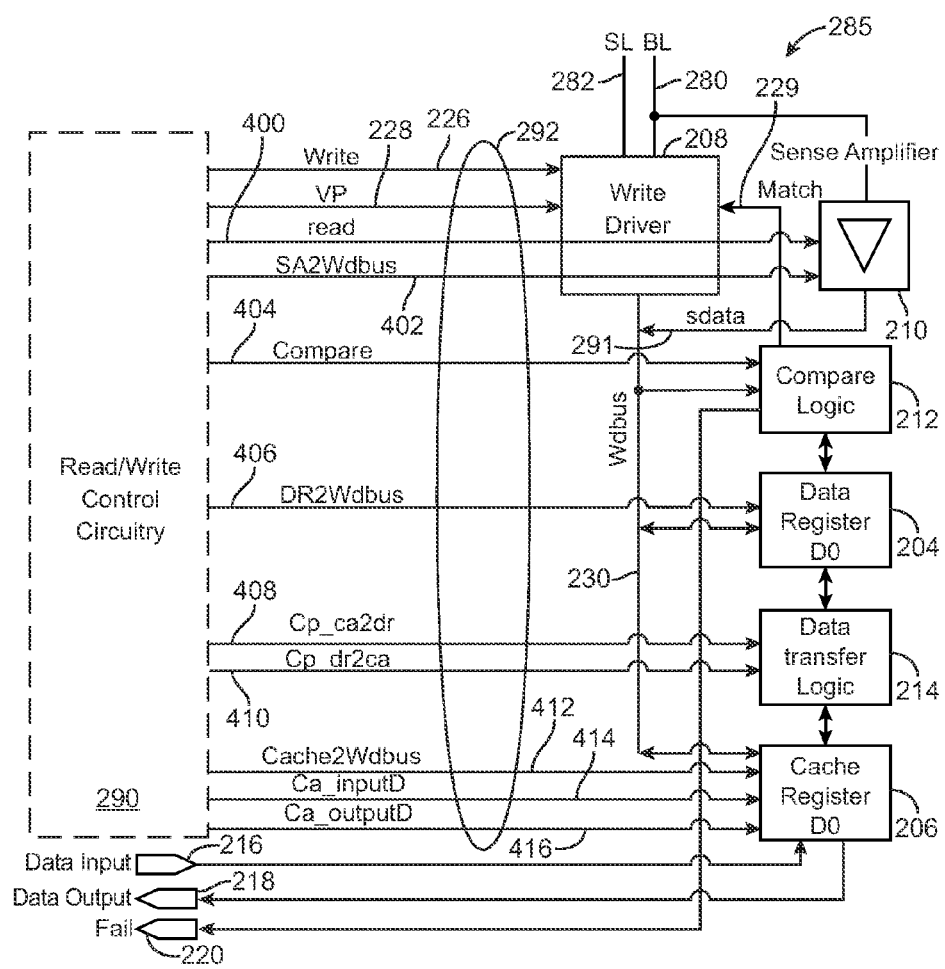
FIG. 13 shows further details of the coupling between the read/write control circuitry 290 and the read/write logic 285, in accordance with an embodiment of the present invention.

FIG. 13 shows further details of the coupling between the read/write control circuitry 290 and the read/write logic 285, in accordance with an embodiment of the present invention. The control signals 292 are shown to include the write signal 226, the Vp 228, the read signal 400, the sense amplifier to word bus (SA2Wdbus) signal 402, the compare signal 404, the data register-to-word bus (DR2Wdbus) signal 406, the control for cache-to-data register (Cp_da2dr) signal 408, the control for data register-to-cache (Cp_dr2ca) signal 410, the cache-to-word bus (Cache2Wdbus) signal 412, the cache input data (Ca_inputD) signals 414, and the cache output data (Ca_outputD) signals 416.

The write signal 226 and the Vp 228 are used by the write driver 208, as previously described. The read signal 400 is provided from the circuitry 290 to the sense amplifier 210 for causing the amplifier 210 to read the contents of an MTJ. The signal 402 causes the amplifier 210 to place sdata 291 onto the Wdbus 230, which is shared with the compare logic 212, the data register D0 204, and the cache register D0 206. The compare signal 404 serves as input the compare logic 212 to cause the latter to compare the data that has been read by the sense amplifier 210 (sdata 291) to the data in the data register D0 204. The signal 406 controls when the data register D0 204 places data onto the Wdbus 230. The signal 408 causes the data transfer logic 214 to transfer data from the cache register D0 206 to the data register D0 204 and the signal 410 causes the data transfer logic 214 to transfer data from the data register D0 204 to the cache register D0 206. The signal 412 controls when the cache register D0 206 places data onto the Wdbus 230. The signals 414 carry the data that it to be input to the cache register D0 206 from the circuitry 290 and the signals 416 carry the data that is to be read (or output) form the cache register D0 206 to the circuitry 290. A timing diagram showing the relationship of the foregoing signals is shown in FIG. 14.

Figure 14:
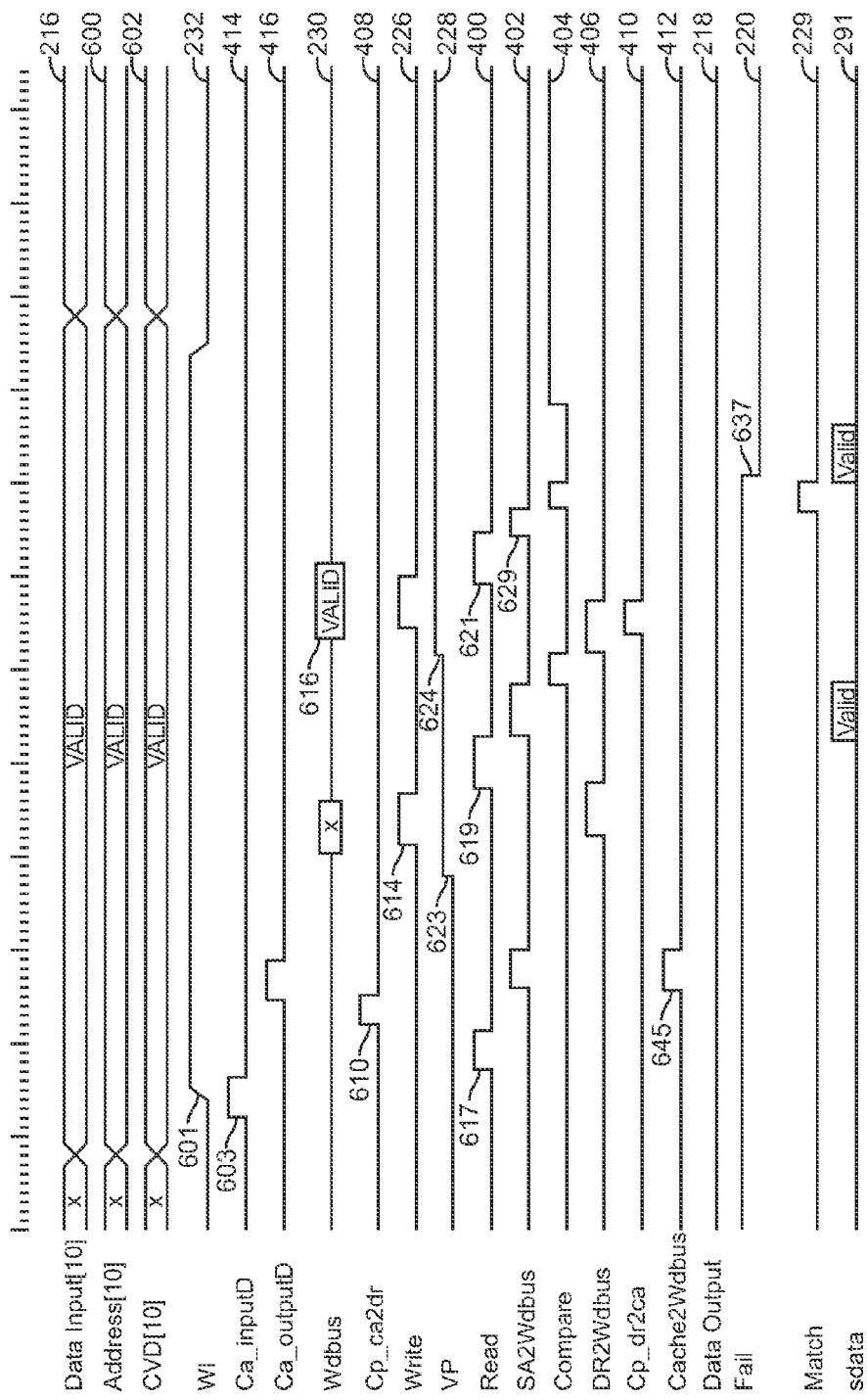
FIG. 14 shows a timing diagram of the relevant signals shown in FIG. 13.

FIG. 14 shows a timing diagram of the relevant signals shown in FIGS. 11 and 13. In FIG. 14, the behavior of the signals, shown in FIG. 13, are illustrated when a read and a write operation are performed on the set of MJTs 238. More particularly, the operations performed are to write to one of the set of MTJs 238 of FIG. 11 but first, as earlier noted, a read operation takes place to preserve the contents of the MTJ of the set of MTJs 238 to which no operation is intended. The address bus 600 ("Address [10]") in FIG. 14, from which the column address and row address are derived, carries the address of a memory location within the memory array 202 to which a read/write operation is directed and the command 602 carries the type of operation being performed and is an input the read/write control circuitry of FIG. 11. Command carries information such as a read or writes operation.

Upon an address, command and in-coming data being coupled onto the address bus 600, command 602 ("CVD[10]") and the in-coming data 216 ("Data Input[10]"), respectively, the signal 414 is activated at 603 and causes the cache register 206 to store the in-coming data 216 and the WL 232 ("Wl") is activated at 601. Next, the read signal 400 is activated at 619 causing the sense amplifier 210 to read an MTJ whose contents is not intended to be changed and is rather being preserved while writing is taking place of the other MTJ of the same set of MTJs. The contents of the read MTJ is stored in the sense amplifier 210 and some time before the signal 408 is activated, the stored content of the read MTJ is placed onto the sdata 291 and the Wdbus 230 and stored in the data register D0 204. Next, the signal 408 is activated, at 610, and the contents of the data register D0 204 and the cache register D0 206 are swapped after the write signal 226 is activated at 614 by activating the signals 406 and 412 (at 645) and placing the data being swapped onto the Wdbus 230 at 616. Accordingly, the data to be written is now in the data register D0 204 awaiting successful programming. The match signal 229 remains inactivated and the fail signal 220 indicates a failed state.

It is noted that at times herein, term "voltage level" is used interchangeably with and intended to have the same meaning as the term "voltage".

A voltage level in accordance with the MTJ being programmed is applied through Vp 228 and the write driver 208, next and upon the application of Vp, the state of the MTJ being programmed is read by activating the read signal 400 again at 621. The sense amplifier is used to do this reading and the outcome of the read MTJ is placed onto sdata 291 by activating the signal 402 at 619. At 624, Vp 228 is incremented and another read cycle is initiated at 626 to determine whether the last write is successful and the process continues until the write operation is deemed successful at which time, the match signal 229 is activated and the fail signal 220 indicates a successful write for the set of MTJs 238. In one embodiment of the present invention, such as that whose behavior is shown in FIG. 14, the fail signal 220 typically indicates a failure until a successful write operation is detected. In the timing diagram of FIG. 14, three read pulses are shown at 617, 619 and 621 because of a failure to write. That is, as earlier discussed, the voltage level of the BL/SL is incremented and a read to verify the write operation is performed to determine whether the write operation was successful and when not, the fail signal remains indicating a failure. In the example of FIG. 14, there was a need for two voltage level increments, shown at 623 and 624, before a success write was declared, otherwise, the fail signal 220 would have gone to a low state earlier than at 637.

It is noted that raising or incrementing Vp 228 results in raising or incrementing the write driver BL 280 and write driver SL 282.

A similar timing diagram applies to the embodiment where no data transfer logic is employed but the signal 408 is provided by the read/write control circuitry to the data transfer logic 214 and the signal 410 is provided by the read/write control circuitry to the cache register D0 206 or vice versa.

It is understood that the foregoing timing diagrams merely represent an exemplary implementation and behavior of signals and that other ways of implementing various embodiments of the present invention, such as using different signals and/or the same signals exhibiting different behavior, is contemplated.

Figure 15:
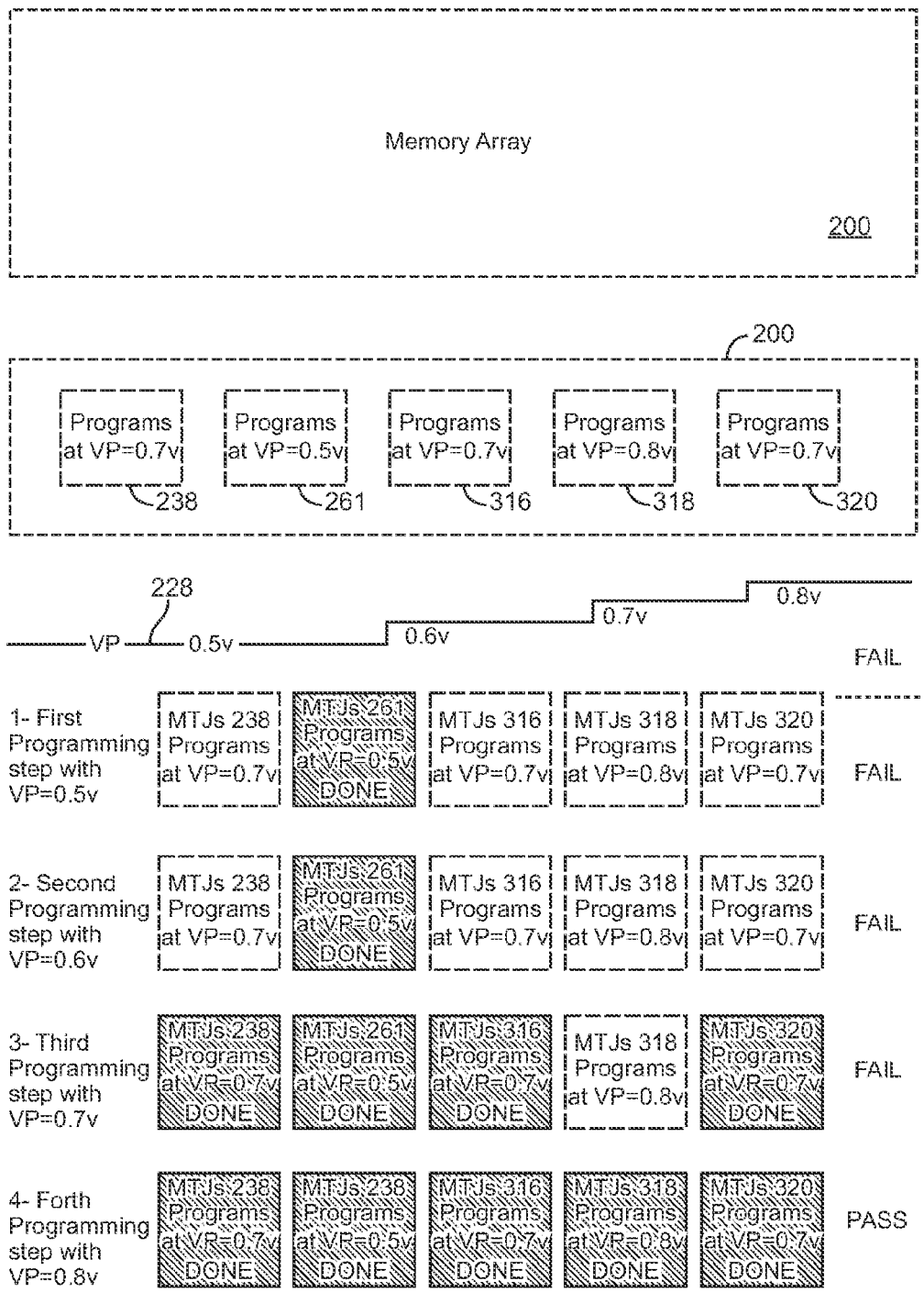
FIG. 15 shows an example of incrementally stepping though various Vp levels to program all of the sets of MTJs or at least one of the MTJs of the sets of MTJs of the memory array 200.

FIG. 15 shows an example of incrementally stepping though various Vp levels to program all of the sets of MTJs or at least one of the MTJs of the sets of MTJs of the memory array 200. That is, as will be discussed further hereinbelow, either both (or all) of the MTJs of a set of MTJs is programmed or one of the set of MTJs is programmed.

In an exemplary embodiment, as shown in FIG. 15, the memory array 200 includes the set of MTJs 316, 318 and 320 in addition to the set of MTJs 238 and 261 and the Vp 228 has a range of 0.5V to 0.8V. The set of MTJs 238 programs when the voltage level of Vp 228 is at 0.7V and the set of MTJs 261 programs when voltage level of Vp 228 is at 0.5V and the set of MTJs 316 programs when voltage level of Vp 228 is at 0.7V and the set of MTJs 318 programs when voltage level of Vp 228 is at 0.8V and the set of MTJs 320 programs when voltage level of Vp 228 is at 0.7V. Such programming levels are set for each set of MTJs during manufacturing of the system 200. It is understood that the foregoing voltage levels are merely exemplary and other voltage levels are contemplated.

During a first step, Vp 228 is at 0.5V and because the set of MTJs 261 programs at 0.5V, after step 1, the set of MTJs 261 is programmed (indicated as "DONE" in FIG. 15)) but other sets of MTJs, such as those indicated in FIG. 15 to be Programs at VP=0.7v, stated of "MTJs 238", "MTJs 316" and "MTJs 320", and those indicated to be Programs at VP=0.8, stated of "MTJs 318", are not because the voltage level of Vp 228 is lower than that which is need to program other sets of MTJs. Accordingly, the compare logic 212 detects a match and the match signal 229 indicates successful programming of the set of MTJs 238 and the write driver 208 disconnects itself from the rest of the read/write circuitry of the system 200. However, because not all of the sets of MIN are programmed after the completion of step 1, the fail signal 220 indicates 'fail' ("FAIL" in FIG. 15) or failure to program all of the sets of MTJs. Next, at step 2, the voltage level of Vp 228 is incremented to 0.6V by the write driver of those sets of MTJs that remain to be programmed. As previously noted, the write driver of the set of MTJs that was programmed successfully in step 1 is effectively disconnected from the remaining read/write circuitry. Thus, at step 2, the sets of MTJs 238, 316, 318 and 320 receive Vp 228 at a voltage level of 0.6V and the set of MTJ 261 does not. After step 2, no additional sets of MTJs are programmed and the process proceeds to the third step, step 3 and the fail signal 220 remains indicating 'fail'.

At step 3, the write driver of all those sets of MTJs that have not yet been programmed, namely, the sets of MTJs 238, 316, 318 and 320, increments and applies an incremented voltage level of 0.7V, onto Vp 228, to the foregoing sets of MTJ. After step 3, the set of MTJs 238, 316 and 320 join the set of MTJ 261 in being successfully programmed ("DONE") but because the set of MTJ 318 remains un-programmed, the fail signal 220 still indicates 'fail' until after the completion of step 4 where all sets of MTJs are programmed and the state of the fail signal 220 changes to indicate successful programming of all of the sets of MTJs. As previously indicated, in some embodiments, all MTJs in the sets of MTJs being programmed are actually programmed whereas in other embodiments one or a sub-set of MTJs of the sets of MTJs are actually programmed.

It is noted that while in FIG. 15, four steps are shown to program the sets of MTJs, any number of steps may be employed to achieve successful programming of all of the sets of the MTJs.

Figure 16:
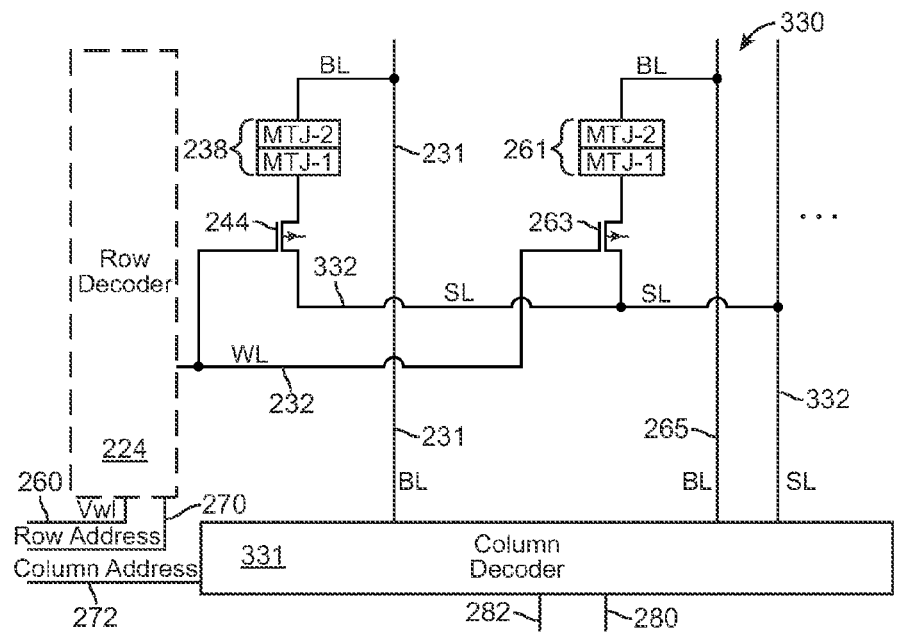
FIGS. 16-19 show various embodiments of the magnetic memory array within the system 200.

FIGS. 16-22 show various embodiments of the magnetic memory array within the system 200. FIG. 16 shows the magnetic memory array 330 to include the sets of MTJs 238 and 261, the row decoder 224, the access transistor 244 and the access transistor 263. The column decoder 331 generates multiple bit lines, as in the embodiment of FIG. 11, however, it only generates one SL. The BL 231 is coupled as shown and discussed relative to FIG. 11. The coupling of the foregoing structures to each other is as shown and discussed relative to FIG. 11 except that the source of each of the access transistors is coupled to a common SL. That is, the SL 332, generated by the column decoder 222, is coupled to the source of all of the access transistors, such as the access transistors 244 and 263. As in FIG. 11 and all figures to follow, while only a couple of sets of MTJs are shown in FIG. 16, any number of sets of MTJs and their corresponding circuitry, such as access transistors, may be and are typically employed in a magnetic memory array.

Because of the common SL 332, it is important that the voltage level of the BLs track the voltage level of a corresponding SL. That is, the column decoder 331 no longer floats the BLs of those sets of MTJs that are not being selected for programming or reading, such as in FIG. 11, rather, the BLs are either at a logic state '0' or '1' depending on whether their corresponding sets of MTJs is being selected or not. As an example, in FIG. B, when the set of MTJs 261 is not being programmed, the BL 265 is substantially at the same voltage level as that of SL 332 thereby avoiding current passing through the set of MTJs 261.

The reason for the requirement for the voltage level of BL to track that of SL is that when a set of MTJ is not selected, the SL and BL thereof are the same value causing approximately no current to flow through the corresponding set of MTJ and no programming or reading of the set of MTJ can be performed.

Figure 17:
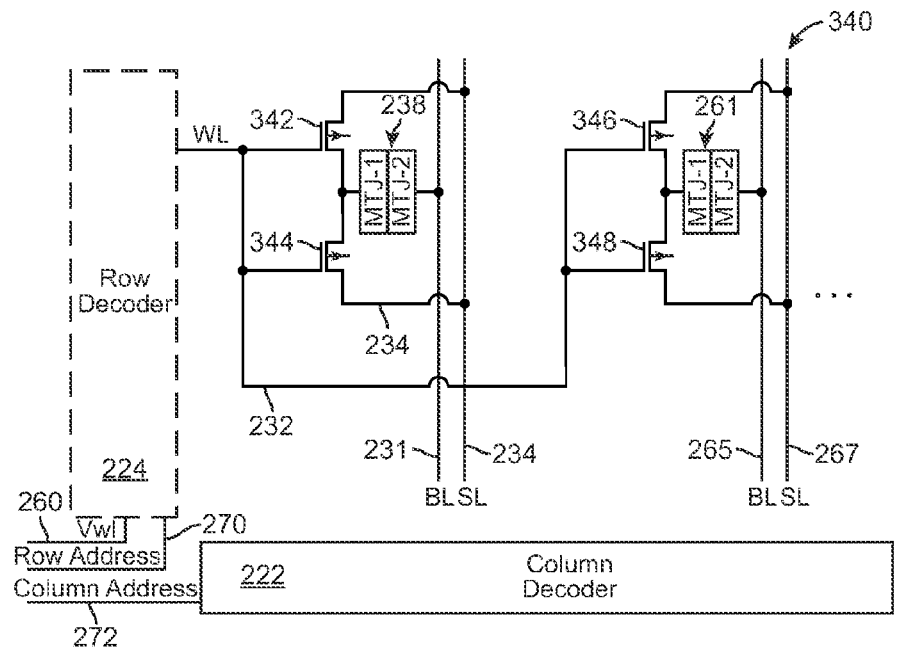

In the embodiment of FIG. 17, a magnetic memory array 340 is shown to include two access transistors per set of MTJs. For example, the set of MTJs 238 is accessed using the access transistors 342 and 344 and the set of MTJs 261 is accessed using the access transistors 346 and 348. Each of the access transistors 342-348 has the WL 232 coupled to its gate but the drain of the access transistor 342 and the source of the access transistor 344 are coupled to the SL 234 and the source of the access transistor 342 and the drain of the access transistor 344 are coupled to the set of MTJs 238 at an end that is not coupled to the BL 231 and in this manner, the access transistors 342 and 344 are coupled together in parallel. Similarly, the access transistors 346 and 348 are coupled together in parallel and in an analogous manner as discussed relative to the access transistors 342 and 344, to the set of MTJs 261. Use of two access transistors to access a set of MTJs advantageously maintains the width of the transistors, during manufacturing, at a suitable size thereby saving real estate and reducing manufacturing costs. Typically, the width of an access transistor needs to be large to accommodate a high current flow through the set of MTJs. For example, current levels exceeding 200 micro Amps (mA) through a set of MTJs, are known to require higher widths of transistors. The embodiment of FIG. 17 avoids the need for larger-sized transistors by using more than one access transistor offering the advantages indicated above.

Figure 18:
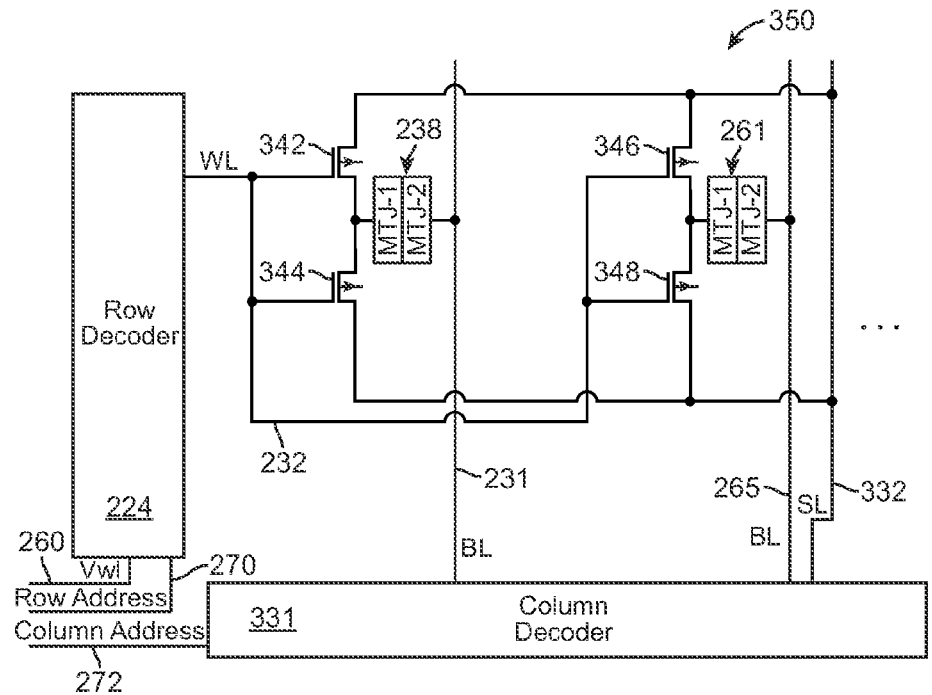

FIG. 18 shows a magnetic memory array 350 to be a combination of the embodiments of FIGS. 16 and 17 in that a common SL 332 is used and coupled to the access transistors associated with the set of MTJs as in the magnetic memory array 330 yet two access transistors are used per set of MTJ, as in the magnetic memory array 340.

Figure 19:
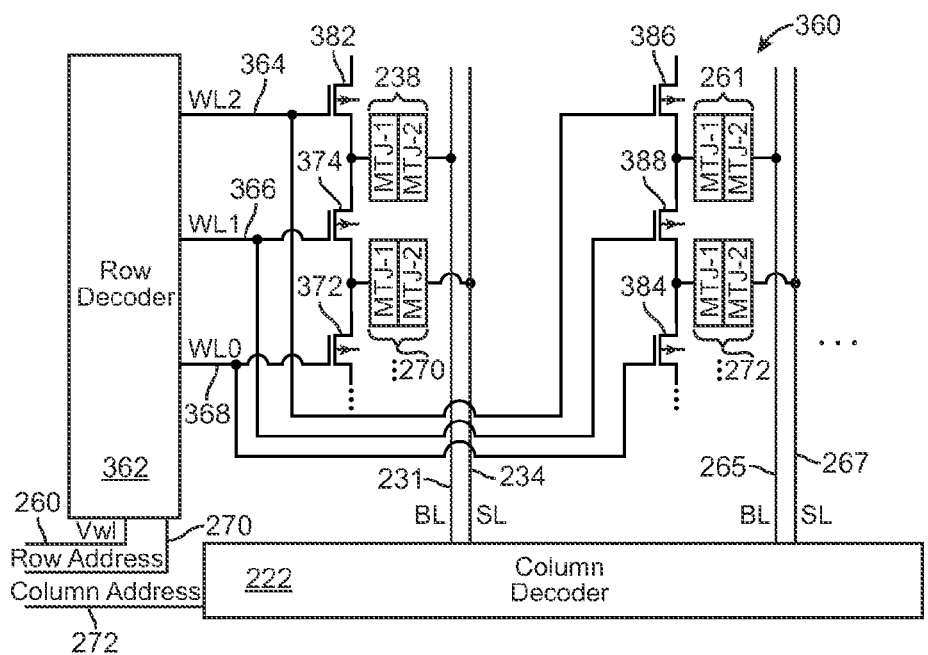

FIG. 19 shows a magnetic memory array 360 to use one access transistor per set of MTJ while maintaining the size of the access transistor at a reasonable manufacturing size even though a high level of current flows through the set of MTJs by using multiple word lines. The array 360 is shown to use three word lines, WL0 368, WL1 366 and WL2 364, per two sets of MTJs and two access transistors per two sets of MTJs. This is accomplished by sharing access transistors between adjacent sets of MTJs.

The access transistor 382 accesses the set of MTJs 238 and the set of MTJ adjacently above (not shown) the set of MTJs 238. The access transistor 374 accesses the set of MTJs 238 and the set of MTJs 270. The access transistor 372 accesses the set of MTJs 270 and a set of MTJ (not shown) adjacently below the set of MTJs 270. The WL0 368 is shown coupled to the gate of access transistors in like locations, such as the access transistors 372 and 384. The WL1 366 is shown coupled to the gate of access transistors in like locations, such as the access transistors 374 and 388 and the WL2 364 is shown coupled to the gate of access transistors in like locations, such as the access transistors 382 and 386. The source of the access transistor 382 and the drain of the access transistor 374 are shown coupled to the set of MTJs 238 at an end that is not coupled to the BL 231 and the source of the access transistor 374 and the drain of the access transistor 372 are shown coupled to the set of MTJs 270 at an end that is not coupled to the SL 234. The access transistors 384, 388 and 386 are coupled to the set of MTJs 261 and 272 in a manner analogous to the coupling of the access transistors 382, 374 and 372 to the set of MTJs 238 and 270. It is understood that while three WLs, WL0-WL3, are shown in FIG. 19, any number of word lines, suitable for addressing the set of MTJs of the memory system may be employed. The WLs are generated by decoding at least the row address, as is readily known to those skilled in the art. In the embodiment of FIG. 19, depending on the row address, two word lines are selected or activated to access a set of MTJs. The embodiment of FIG. 19 advantageously has increased memory capacity because, among other reasons, as two sets of MTJs are accessed by only three access transistors, the latter being each shared, as noted above. This leads to increased sets of MTJs per unit area over that of the prior art memory systems and the embodiments of Figs. A-C thereby resulting in an increase in memory capacity on a chip or semiconductor.

FIG. 20 shows a magnetic memory system 420, in accordance with an embodiment of the present invention. The magnetic memory system 420 is shown to include a magnetic memory array 422, read/write circuitry 424 and 500 and read/write control circuitry 426.

The array 422 is analogous to the array 202. The read/write circuitry 424 is shown to include a write driver 528, a sense amplifier 510, a compare logic 512, a data register D0 514 and a cache register D0 516 and the read/write circuitry 500 is shown to include a write driver 518, a sense amplifier 532, a compare logic 530, a data register D1 528 and a cache register D1 526. The write drivers 508 and 518 are each analogous to the write drivers of the system 200. Similarly, the sense amplifiers 510 and 532 are analogous to the sense amplifiers of the system 200. Further similarly, the compare logics 512 and 530 are analogous to the compare logics of the system 200. However, the read/write control circuitry 426 generates control signals 428 to accommodate the absence of the data transfer logic in each of the read/write circuitries 424 and 500.

More specifically, there is no data transfer logic coupled between the compare logic 512 and the cache register D0 516 or between the data register D1 528 and the cache register D1 526, as is the case in the system 200. Rather, data is swapped between data registers and cache registers under the control of the read/write control circuitry 426 through the control signals 428, as will be evident with reference to a timing diagram presented and discussed relative to a subsequent figure herein.

FIG. 21 shows a magnetic memory system 550, in accordance with yet another embodiment of the present invention. The magnetic memory system 550 is shown to include a magnetic memory array 552 and read/write circuitries 554 and 556. The magnetic memory array 552 is analogous to the array 202.

A read/write control circuitry, while not shown in FIG. 21, couples to the read/write circuitries 554 and 556, using control signals (not shown), analogously to the read/write circuitries of previous embodiments, such as that of FIG. 20.

The read/write circuitry 554 is shown to include a write driver 558, analogous to the write drivers of previous embodiments, except that the write driver 558 receives two Vps, i.e. Vp 562 and Vp 564. Each Vp is used to program or write to one of the MTJs in a corresponding set of MTJs. The read/write circuitry 554 generally programs the set of MTJs 592 in the magnetic memory system 550, which is analogous to arrays of previous memory arrays. The read/write circuitry 554 is further shown to include a compare logic 566, a data register D0 568, a cache register D0 570, a compare logic 574, a data register D1 576 and a cache register D1 578. Thus, the read/write circuitry 554 includes two sets of logic or circuitry for writing to two MTJs substantially simultaneously. Similarly, the read/write circuitry 556 also includes two sets of logic/circuitry for writing to two MTJs substantially simultaneously. Specifically, in the embodiment of FIG. 21, the read/write circuitry 554 writes to the MTJs of the set of MTJ 592, which is included in the array 552 and the read/write circuitry 556 writes to the MTJs of the set of MTJ 594. Accordingly, four bits of data are written by the read/write circuitries 554 and 556 substantially simultaneously thereby advantageously increasing the performance of the embodiment of FIG. 21 over prior art techniques and previous embodiments herein. The Vp1 562 and the Vp2 564 are incrementally increased, in voltage level, to program each of the MTJs of the sets of MTJs 592 and 594, as discussed relative to the embodiments where one Vp is used, such as relative to the embodiment of FIG. 11.

In an alternative embodiment, a data transfer logic is included in each read/write circuitry of FIG. 21, similar to that which is shown and discussed relative to FIG. 11.

Figure 22:
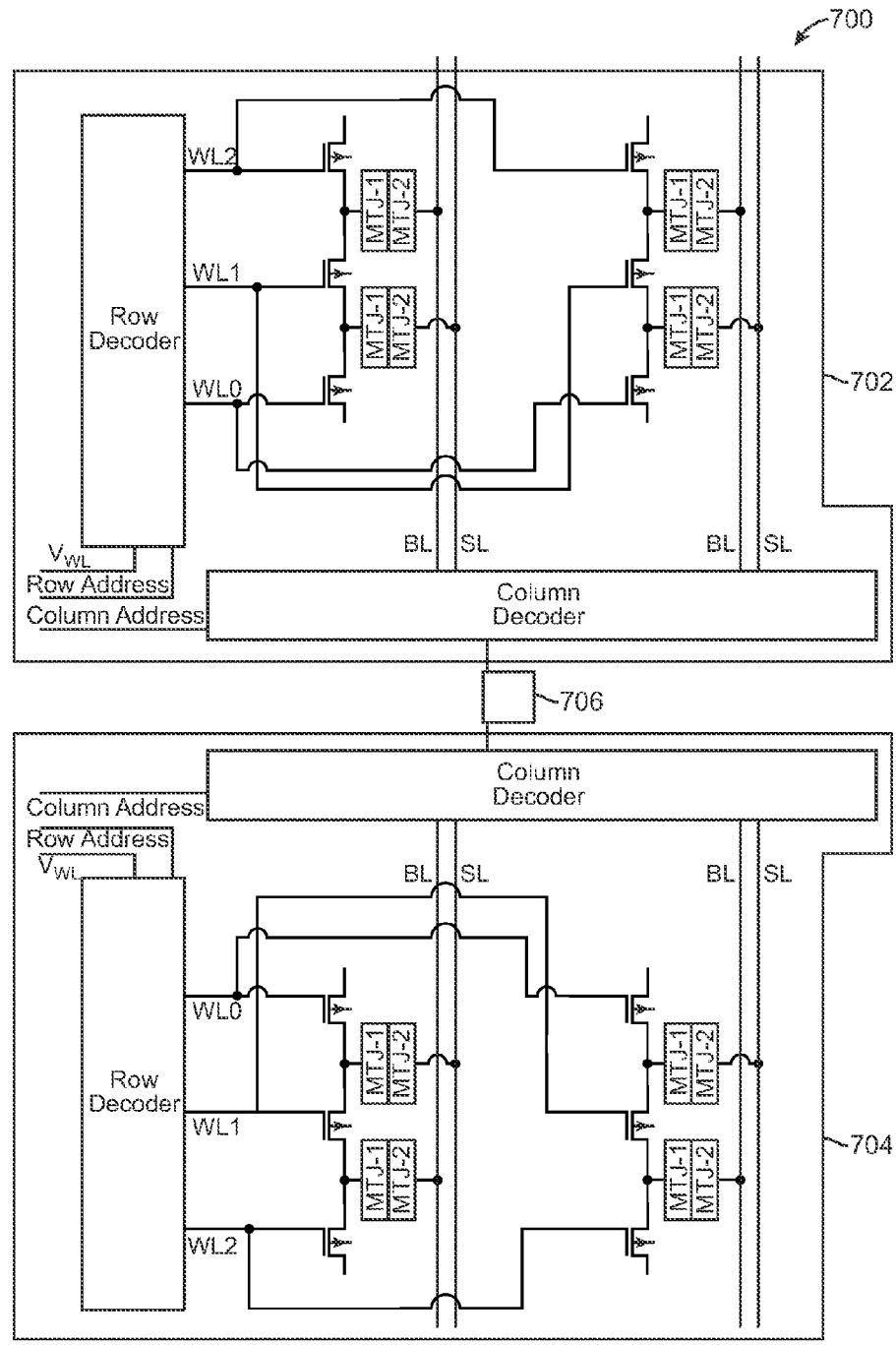
FIG. 22 shows a magnetic memory system 700, in accordance with an embodiment of the present invention.

FIG. 22 shows a magnetic memory system 700, in accordance with yet another embodiment of the present invention. The magnetic memory system 700 is shown to include a magnetic memory array 702 and a magnetic memory array 704 and a read/write circuitry 706 coupled therebetween, in accordance with an embodiment of the present invention. Each of the arrays 702 and 704 is analogous to a magnetic memory array of the previously shown and discussed embodiments, such as the magnetic memory array 360 of FIG. 19. The read/write circuitry 706 is the circuit used to cause reading/writing of the memory cells of the arrays 702 and 704 and analogous to the a combination of read/write circuitry shown in previous embodiments, such as for example, the combination of the read/write control circuitry 426, the read/write circuitry 424 and the read/write circuitry 500 or the read/write circuitry 554 and the read/write circuitry 556 or any other similar circuitry.

Figure 23:
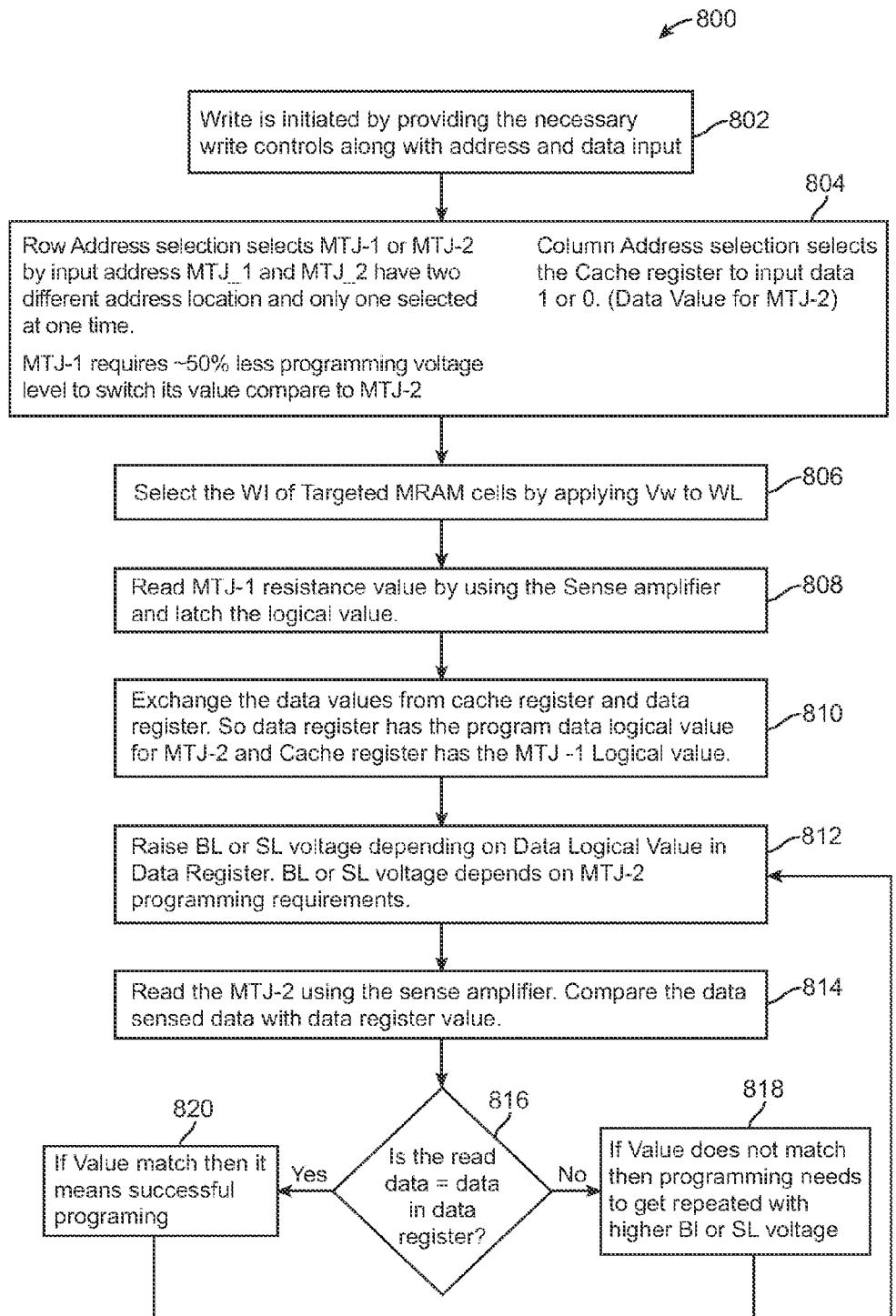
FIG. 23 shows a flow chart of the steps performed by the embodiment of FIG. 11 or the system 200 when reading and writing to an MTJ, in accordance with a method of the present invention.
Figure 23:
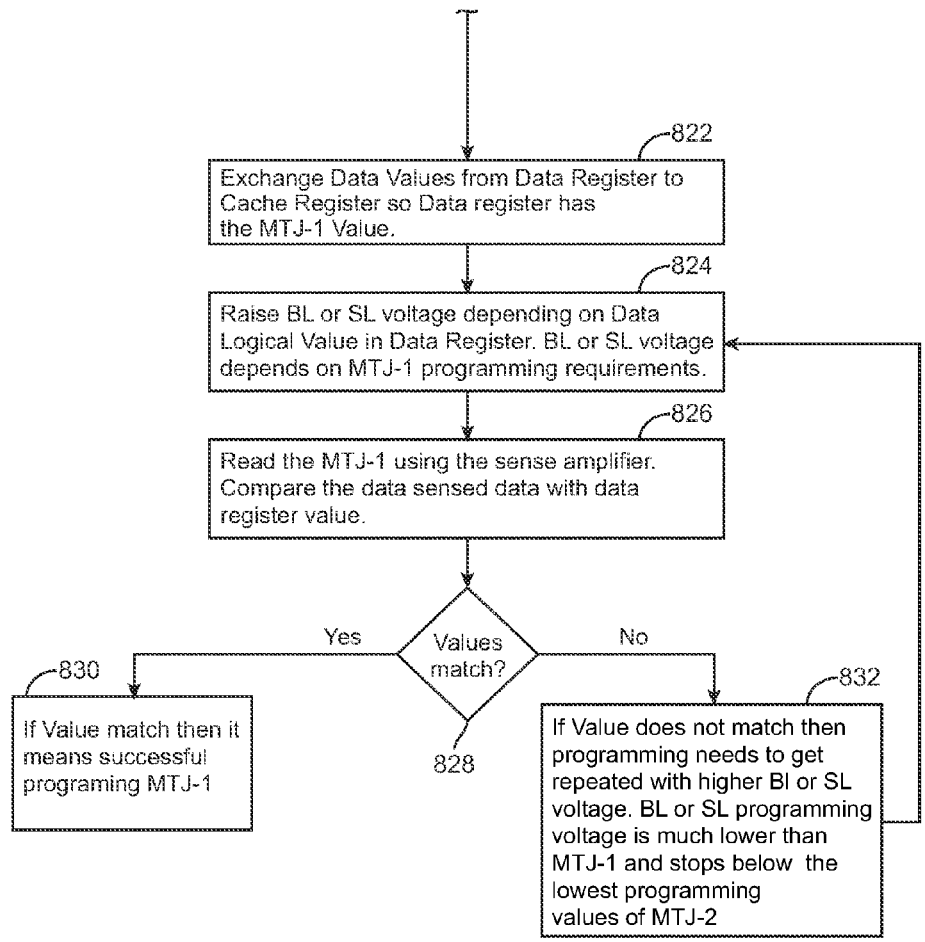

FIG. 23 shows a flow chart of the steps 800 performed by the embodiment of FIG. 11 or the system 200 when reading and writing to an MTJ, in accordance with a method of the present invention. In the example of FIG. 23, MTJ-2 of the set of MTJs, such as the MTJ 240 of FIG. 11, is selected to be written.

At step 802, a write operation is initiated by providing the necessary write controls along with address and data, as discussed previously herein. Next, at step 804, through the row address selection, MTJ-1 or MTJ-2 is selected by applying a corresponding address to the address bus. It is noted that typically, MTJ-1 requires approximately 50% less programming voltage level to switch its value compared to MTJ-2. Also, at step 804, a column address is used to select the cache register to input data value '1' or '0' for MTJ-2. Next, at step 806, the word line (WL) of the targeted or desired MRAM cell is selected by applying Vw to WL. Next, at step 808, MTJ-1's resistance value is read by using the sense amplifier and the read value is latched. Next, at step 810, the data values or contents of the cache and data registers are exchanged such that the data of the data register is the data to be programmed into MTJ-2 and the contents of the cache register is the contents of the MTJ-1. Next, at step 812, the BL or SL voltage is raised depending on the data that is in the data register. BL or SL voltage depends on the MTJ-2 programming requirements. Next, at step 814, the MTJ-2 is read using the sense amplifier and compared to the data sensed (or read) from the data register and at 816, if these values are determined to be equal, the write (or program) operation is considered to be successful and the process proceeds to step 820, otherwise, the process proceeds to step 818 where the programming cycle is repeated starting from step 812 but with a higher BL or SL voltage than that which was used in the prior execution of the steps starting from step 812.

At step 820, programming is considered successful and the process proceeds to step 822 where steps begin to restore the contents of MTJ-1. At step 822, data in the data register is exchanged with the data in the cache register with the data register ending up with the value that was in MTJ-1 and next, the step 824 is executed. At step 824, the voltage of BL or SL is raised depending on the value or data in the data register. That is, BL or SL voltage depends on the MTJ-1 programming requirements. Next, at step 826, MTJ-1 is read using the sense amplifier and the read (or sensed) data is compared with the data in the data register and at 828, if a match is detected, the process proceeds to step 830 where programming is considered successful, otherwise, the process proceeds to step 832 where the programming is repeated with BL or SL voltage raised, starting from step 824. The BL or SL programming voltage is much lower than MTJ-1 and stops below the lowest programming values of MTJ-2.

Figure 24:
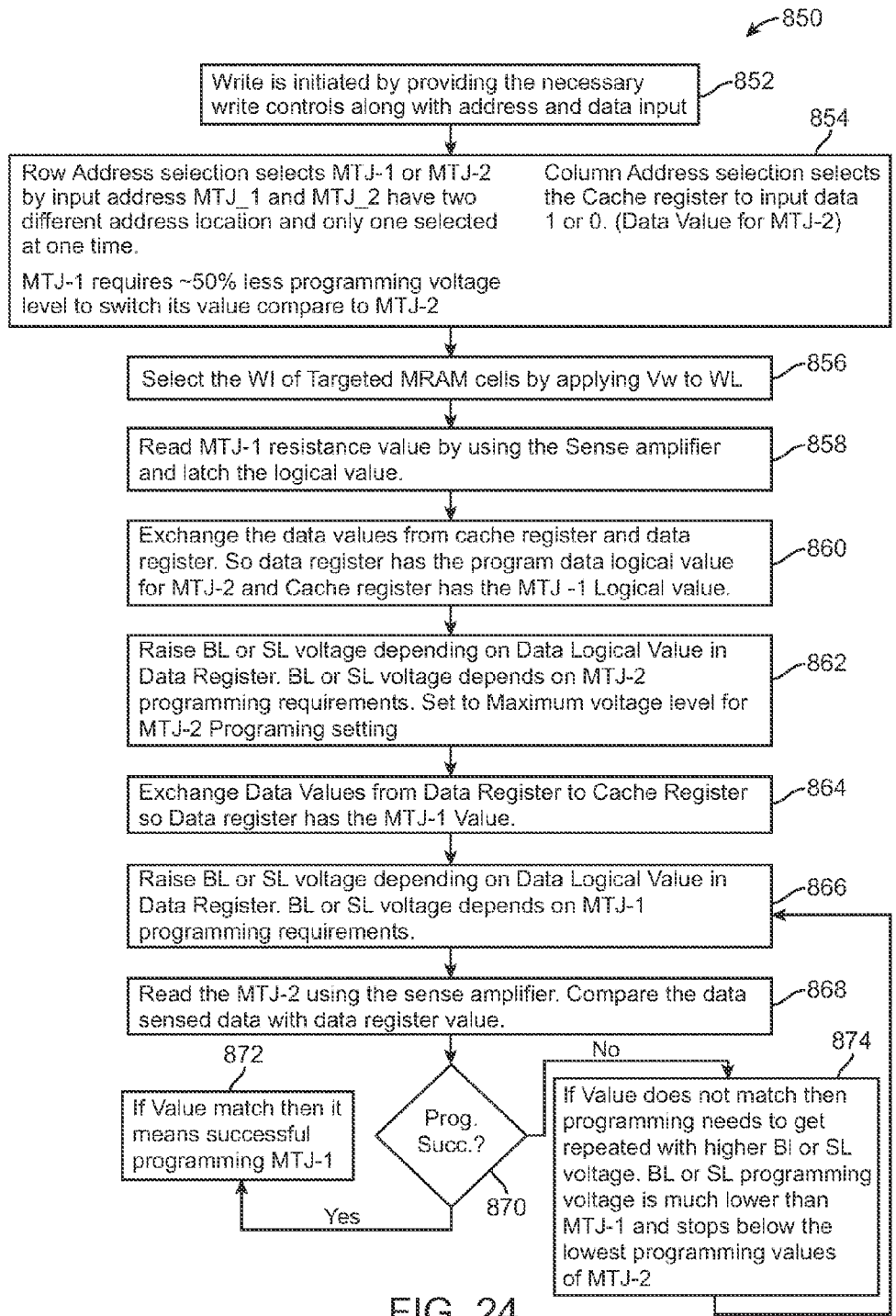
FIG. 24 shows a flow chart of steps performed by the embodiment of FIG. 11 or the system 200 when reading and writing to an MTJ, in accordance with another method of the present invention.

FIG. 24 shows a flow chart of steps 850 performed by the embodiment of FIG. 11 or the system 200 when reading and writing to an MTJ, in accordance with another method of the present invention. The programming (or writing) method of FIG. 24 is faster than that of FIG. 23 for reasons that will be obvious shortly.

Initially, a write operation starts at step 852 by providing the necessary write controls along with address and data as input to the system 200, similar to the step 802 of FIG. 23. Next, at step 854, row address selection is performed to select MTJ-1 or MTJ-2 by coupling a corresponding address (for either MTJ-1 or MTJ-2) onto the address bus to select one of these MTJs at a time. MTJ-1 requires approximately 50% less programming voltage to switch its value in comparison to MTJ-2. Further at step 854, an appropriate column address is used to select the cache register to input either a '1' or '0' as date for storage in MTJ-2.

Next, at step 856, a WL of the targeted or desired MRAM cell is selected by applying Vw to WL. After step 856, step 858 is performed to read MTJ-1's resistance by using the sense amplifier and latching the value. Latching, as used herein, refers to storing or saving. Next, at step 860, the data values from the cache register and data register are exchanged so that the data register has the data that is to be saved in MTJ-2 and the cache register has the value that was/is in MTJ-1, thus, the MTJ-1 contents are preserved. Next, at step 862, BL or SL voltage levels are raised depending on the value in the data register. That is, BL or SL's voltage level depends on MTJ-2's programming requirements. The voltage level of BL or SL is set to a maximum voltage level for programming MTJ-2, which is one of the differences between the method of FIG. 24 and that of FIG. 23 with the programming operation being faster in the method of FIG. 24 because of the foregoing setting.

This concludes the programming of MTJ-2 but now, the contents of MTJ-1 need be preserved, which involves the following steps. After step 862, at step 864, the data or contents of the data register and cache register are exchanged so that the data register now has the contents of MTJ-1. Next, at step 866, BL or SL voltage level is raised depending on the value in the data register. The voltage level of BL or SL depends on the programming requirements of MTJ-1. Next, at step 868, MTJ-1 is read using the sense amplifier and a comparison of the data that is read (or sensed) and the data that is in the data register is performed. At 870, if the result of this comparison yields that the two values are equal, the process proceeds to step 872 where a match is noted and programming of MTJ-1 (or the preservation of MTJ-1's contents) is considered successful, otherwise, the process proceeds to step 874 where programming is repeated starting from step 866 using a higher BL or SL voltage level. It is noted that the BL or SL programming voltage level is much lower than MTJ-1's programming voltage level and stops below the lowest programming voltage level of MTJ-2.

It is understood that the methods and embodiments of the present invention for programming of (or writing to) an MTJ are applicable to any type of MTJ and further to any programmable non-volatile and variable resistive memory element that is coupled in series with another.

Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A method of writing to magnetic tunnel junctions (MTJs) of a magnetic memory array comprising:
   storing in-coming data in a cache register;
   reading a present logic state of a first MTJ of a set of at least two MTJs, the set of at least two MTJs including the first MTJ and a second MTJ, and being a part of a magnetic memory array, the in-coming data to be written into the second MTJ;
   storing the read logic state into a data register;
   swapping the contents of the data register and the cache register so that the cache register stores the read logic state and the data register stores the in-coming data;
   applying a first predetermined voltage level to the set of at least two MTJs thereby causing the first MTJ to be over-written;
   applying a second predetermined voltage level set of at least two MTJs; and
   storing the in-coming data into the second MTJ.

2. The method of writing to magnetic tunnel junctions (MTJs), as recited in claim 1, wherein during the applying a first predetermined voltage level, the first predetermined voltage is applied to a bit line coupled to the set of at least two MTJs and during the applying a second predetermined voltage level, the second predetermined voltage level is applied to the bit line.

3. The method of writing to magnetic tunnel junctions (MTJs), as recited in claim 1, wherein the second predetermined voltage is greater than the first predetermined voltage level and after the applying a second predetermined voltage level, incrementing the second predetermined voltage level and applying the incremented voltage level to the bit line and continuing to apply an incrementally greater voltage level than a preceding predetermined voltage level until the incoming data is stored into the second MTJ.

4. The method of writing to magnetic tunnel junctions (MTJs), as recited in claim 1, wherein during the applying of the first predetermined voltage level step, the first predetermined voltage level is applied to a word line coupled to an access transistor that is coupled to the set of at least two MTJs and during the applying of the second predetermined voltage level step, the second predetermined voltage level is applied to the word line that is coupled to the access transistor.

5. The method of writing to magnetic tunnel junctions (MTJs), as recited in claim 4, wherein the second predetermined voltage level is greater than the first predetermined voltage level and after the applying of a second predetermined voltage level step, incrementing the second predetermined voltage level and applying the incremented voltage level and continuing to apply incrementally greater voltage levels than a preceding predetermined voltage level until the in-corning data is stored into the second MTJ.

6. The method of writing to magnetic tunnel junctions (MTJs), as recited in claim 4, wherein during the applying a first predetermined voltage level step, the first predetermined voltage level is applied to a bit line coupled to the set of at least two MTJs and during the applying a second predetermined voltage level step, the second predetermined voltage is applied to the bit line.

7. A spin-transfer torque magnetic random access memory (STTMRAM) of a magnetic memory array comprising:
   a cache register responsive to in-coming data;
   a first magnetic tunnel junction (MTJ) of a set of at least two MTJs, the set of at least two MTJs including the first MTJ and a second MTJ, and being a part of a magnetic memory array, the in-coming data to be written into the second MTJ, the first MTJ having a present logic state;
   a data register responsive to the read logic state and operative to store the same, wherein the contents of the data register and the cache register are swapped so that the cache register stores the read logic state and the data register stores the in-coming data, further wherein, the set of at least two MTJs is applied a first predetermined voltage level thereby causing the first MTJ to be over-written, and subsequently the set of at least two MTJs is applied a second predetermined voltage level, and the in-coming data is stored into the second MTJ.

8. The spin-transfer torque magnetic random access memory (STTMRAM), as recited in claim 7, wherein when the first predetermined voltage level is applied to a bit line that is coupled to the set of at least two MTJs and during the applying of the second predetermined voltage level, the second predetermined voltage level is applied to the bit line.

9. The spin-transfer torque magnetic random access memory (STTMRAM), as recited in claim 7, wherein the second predetermined voltage is greater than the first predetermined voltage level.

10. The spin-transfer torque magnetic random access memory (STTMRAM), as recited in claim 9, wherein after the second predetermined voltage level is applied, the second predetermined voltage level is incremented and the incremented voltage level is applied to the bit line and an incrementally greater voltage level than a preceding predetermined voltage level is continuously applied until the in-coming data is stored into the second MTJ.

11. The spin-transfer torque magnetic random access memory (STTMRAM), as recited in claim 7, further including an access transistor coupled to the set of at least two MTJs, wherein during the applying of the first predetermined voltage level step, the first predetermined voltage level is applied to a word line that is coupled to the access transistor and during the applying of the second predetermined voltage level step, the second predetermined voltage level is applied to the word line.

12. The spin-transfer torque magnetic random access memory (STTMRAM), as recited in claim 7, wherein the second predetermined voltage level is greater than the first predetermined voltage level and after applying the second predetermined voltage level step, the second predetermined voltage level is incremented and the incremented voltage level is applied continuously and in incrementally greater voltage levels than a preceding predetermined voltage level until the in-coming data is stored into the second MTJ.

13. The spin-transfer torque magnetic random access memory (STTMRAM), as recited in claim 7, wherein during applying the first predetermined voltage level step, the first predetermined voltage level is applied to a bit line coupled to the set of at least two MTJs and during applying the second predetermined voltage level step, the second predetermined voltage is applied to the bit line.

* * * * *